United States Patent
Ogihara et al.

(10) Patent No.: US 6,913,985 B2
(45) Date of Patent: Jul. 5, 2005

(54) METHOD OF MANUFACTURING A SEMICONDUCTOR DEVICE

(75) Inventors: Mitsuhiko Ogihara, Hachioji (JP); Hiroyuki Fujiwara, Hachioji (JP); Masaaki Sakuta, Tokyo (JP); Ichimatsu Abiko, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/870,142

(22) Filed: Jun. 18, 2004

(65) Prior Publication Data

US 2004/0259331 A1 Dec. 23, 2004

(30) Foreign Application Priority Data

Jun. 20, 2003 (JP) ........................................ 2003-175715
Jul. 30, 2003 (JP) ........................................ 2003-282869

(51) Int. Cl.[7] ............................................. H01L 21/46
(52) U.S. Cl. ........................ 438/462; 438/465; 438/977
(58) Field of Search ................................ 438/406, 458, 438/459, 462, 465, 977

(56) References Cited

U.S. PATENT DOCUMENTS 5,466,631 A * 11/1995 Ichikawa et al. ............ 438/977
6,274,518 B1 * 8/2001 Yuri et al. ................... 438/459
6,440,822 B1 * 8/2002 Hayama et al. ............. 438/462
6,613,610 B2 * 9/2003 Iwafuchi et al. ............ 438/464
6,802,926 B2 * 10/2004 Mizutani et al. ............ 438/458

FOREIGN PATENT DOCUMENTS

JP    7-202265    8/1995

OTHER PUBLICATIONS

"High Efficiency GaAs Thin Film Solar Cells by Peeled Film Technology", Makoto Konagai et al.: Department of Physical Electronics, Tokyo Institute of Technology, 2–12–1, Ohokayama, Meguro–ku, Tokyo 152, Japan; Journal of Crystal Growth 45 (1978); 4 pages.

* cited by examiner

Primary Examiner—Chandra Chaudhari
(74) Attorney, Agent, or Firm—Rabin & Berdo, P.C.

(57) ABSTRACT

A peeling layer (13) and semiconductor thin film (20a) are formed on a first substrate (11), individual support materials (19) are formed thereupon, grooves (23) penetrating the semiconductor thin film and reaching the peeling layer (13) are formed in the semiconductor thin film (20a) by etching using the individual support materials (19) as a mask so as to divide the semiconductor thin film (20a) into a plurality of semiconductor thin film pieces (20) and form a plurality of assemblies of the semiconductor thin film pieces (20) and the individual support materials (19) fixed thereto, the semiconductor thin film pieces (20) are separated from the first substrate (11) while the individual support materials (19) remain fixed to the semiconductor thin film pieces (20), and they are then affixed to a second substrate (31). The invention facilitates handling of semiconductor thin film pieces.

35 Claims, 38 Drawing Sheets

METHOD OF MANUFACTURING A SEMICONDUCTOR DEVICE

BACKGROUND OF THE INVENTION

This invention relates to a method of manufacturing a semiconductor device, and more specifically to a method of manufacturing a semiconductor device by forming a semiconductor thin film on a first substrate and transferring the thin film to a second substrate. The manufacturing method of this invention may for example be used to manufacture a composite semiconductor device by forming a light-emitting element array in the semiconductor thin film, affixing it to the second substrate and connecting other circuit elements.

An economical method of forming a light-emitting element is to form an intermediate layer on a sapphire substrate, form a compound semiconductor layer thereupon, and form a light-emitting part therein (Japanese Patent Kokai Publication No. H07-202265).

Also a method shown in FIG. 63A and FIG. 63B is known, in which the compound semiconductor is a GaAs semiconductor. In the method shown in FIG. 63, a sacrificial layer, i.e., a peeling layer ($Al_{0.7}Ga_{0.3}As$) 202 is formed between a GaAs substrate 201, and a GaAs thin film 203, as shown in FIG. 63A. The structure shown in FIG. 63A ($GaAs/Al_{0.7}Ga_{0.3}As/GaAs$) is immersed in hydrofluoric acid (HF) to separate the GaAs thin film 203, as shown in FIG. 63B).

In the aforesaid method, when the semiconductor thin film formed on the first substrate is peeled away (lifted off) from the whole surface of the substrate, it takes time for the etching solution used to etch the peeling layer to penetrate the peeling layer, so peeling (lifting-off) of the semiconductor thin film from the substrate is not easy. To resolve this problem, a possible solution is to divide the semiconductor thin film layer into pieces (small island regions formed, for example, by mesa etching) each of which will become a semiconductor device, and then etch the peeling layer underneath the semiconductor thin film.

Another problem arises when the semiconductor thin film may have a thickness of several $\mu m$ or less, and in this case it is extremely difficult to handle the semiconductor thin film, for picking it up and bonding it to a second substrate. To eliminate the difficulty of handling the semiconductor thin films, individual support materials prepared on the semiconductor thin film pieces (island regions of the semiconductor thin film layer) may be provided to give a certain thickness and mechanical strength to the semiconductor thin film.

In the photolithography etching step to divide the semiconductor film into small island regions of semiconductor thin film layer, etching is performed using an etching mask which divides the semiconductor thin film layer into small island regions of semiconductor thin film layer. However, after dividing the semiconductor thin film into small island regions of the semiconductor thin film layer, and removing the etching mask, it is very difficult to provide a support material for handling each semiconductor thin film piece having exactly the same pattern as that of the semiconductor thin film piece; the pattern of the support material may be misaligned to that of the small island regions of the semiconductor thin film layer. When the support material does not cover completely the surface of the small island regions of the semiconductor thin film layer due to misalignment of the pattern of the support materials to the pattern of the small island regions of the semiconductor thin film layer, the edge region of the lifted-off semiconductor thin film pieces may easily break during handling of the lifted-off semiconductor thin film pieces. Also, if the support material pattern happens to cover the side edge regions of the sacrificial layer (the peeling layer) exposed to the air by the mesa etching grooves due to the patterning misalignment, it may be difficult, or even impossible to separate (lift off) the semiconductor thin film piece from the substrate.

On the other hand, if the peeling layer is etched over the whole of the substrate, the semiconductor thin film pieces on the substrate may become dissociated from each other. Also, after the peeling layer is etched over the whole of the substrate, it may be necessary to bond a plurality of (e.g., all) semiconductor thin film pieces to the second substrate all at once. In this case, handling the plurality of semiconductor thin film pieces is very difficult.

SUMMARY OF THE INVENTION

The invention aims at resolving the above problems and its object is to provide a method of easily handling a semiconductor thin film pieces when the semiconductor thin film pieces are lifted off from a first substrate, and wherein the semiconductor thin film pieces can be affixed to a second substrate with high precision.

This invention provides a method of manufacturing a semiconductor device wherein semiconductor thin film pieces are formed on a first substrate, and then transferred to and bonded on a second substrate, comprising the steps of:

forming a peeling layer on said first substrate;

forming a semiconductor thin film layer which will become said semiconductor thin film pieces, on said peeling layer;

forming a support material film on said semiconductor thin film layer;

forming individual support materials by patterning said support material film;

forming grooves extending through said semiconductor thin film layer to said peeling layer by patterning said semiconductor thin film layer using said individual support material as a mask, dividing said semiconductor thin film layer into said plurality of island regions of the semiconductor thin film layer by the grooves, and forming a plurality of assemblies each comprising one of said semiconductor thin film pieces and one of said individual support materials fixed thereto; and peeling (lifting off) said island regions of the semiconductor thin film layer from said first substrate in a state wherein said individual support materials have been fixed to said semiconductor thin film pieces, and affixing said semiconductor thin film pieces to said second substrate.

According to the method of manufacturing a semiconductor device according to the present invention, even if the semiconductor thin film pieces are of small size, they can be handled and separated with ease, and can be affixed to the second substrate with high precision.

DETAILED DESCRIPTION OF THE PREFERRED EMBODIMENTS

Figure 1:
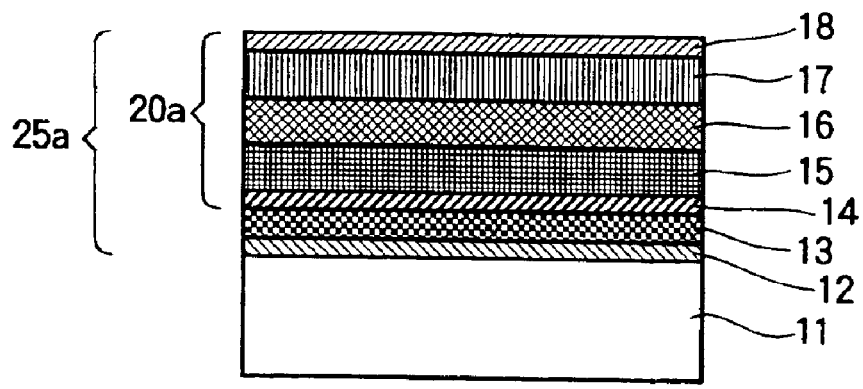
FIG. 1 is a schematic partial cross-sectional view showing the structure obtained by forming a stacked structure of a semiconductor thin film in a manufacturing method according to Embodiment 1 of the present invention.

Embodiments of the present invention will now be described referring to the drawings. Each drawing schematically shows an embodiment, but it is to be understood that the invention is not be construed as being limited in any way by the dimensional relationships and positional relationships shown therein.

The semiconductor thin film piece in the following embodiment forms a light-emitting diode array (LED array) is first formed on a first substrate, and is then removed from the first substrate, and affixed to a second substrate and connected to a driving circuit formed on the second substrate, thereby forming a composite semiconductor device comprising the driving circuit formed on the second substrate and the LED array which is the driven element formed within the semiconductor thin film piece.
Embodiment 1

As shown in FIG. 1, for example a GaAs buffer layer 12, for example an AlAs peeling layer 13, for example a p-type GaAs lower contact layer 14, for example a p-type $Al_xGa_{1-x}As$ lower cladding layer 15, for example a p-type $Al_yGa_{1-y}As$ active layer 16, for example an n-type $Al_zGa_{1-z}As$ upper cladding layer 17 and for example an upper contact layer 18 of n-type GaAs, are formed on a first substrate, for example an n-type GaAs substrate 11.

These layers are obtained by sequential epitaxial growth.

Among these layers, the lower contact layer 14, lower cladding layer 15, active layer 16, upper cladding layer 17 and upper contact layer 18 form a semiconductor thin film layer 20a. The semiconductor thin film layer 20a, buffer layer 12 and peeling layer (sacrificial layer) 13 together form a semiconductor epitaxial film layer 25a.

In the stacked semiconductor structure shown in FIG. 1, in a final form, a semiconductor element is formed after elements are isolated from each other, by for example etching at least parts other than light-emitting areas, from the upper contact layer 18 up to the active layer 16. The element isolation can also be achieved by selectively forming the active regions (by selective formation of impurity-doped regions) in the semiconductor layer (epitaxial layer) where the elements are to be formed.

The semiconductor thin film layer 20a, as described below, is divided into a plurality of island regions 20b of the semiconductor thin film layer by forming the grooves (23), and semiconductor elements (i.e., "semiconductor devices") are formed in respective areas where it is intended to form semiconductor thin film pieces. In this embodiment, it is assumed that the semiconductor thin film pieces form an LED array, and that the LED array is formed from a plurality of LED elements in the semiconductor thin film pieces.

The buffer layer 12 is intended to form a good semiconductor epitaxial film layer free from defects by providing a good surface, alleviating mismatch of lattice constants between the substrate 11 and the epitaxial layers (e.g., AlGaAs layers) (14, 15, 17), and alleviating the difference of thermal expansion coefficients between the substrate 11 and the epitaxial layers (e.g., AlGaAs layers) (14, 15, 17).

The peeling layer 13 is provided in order to peel the semiconductor thin film layer 20a (or the island regions 20b of the semiconductor thin film layer formed by dividing the semiconductor thin film layer 20a as described later) from the substrate 11 by chemical etching, and is consists of a material which can be rapidly etched by an etching solution having much slower etching speed with respect to the layers of the semiconductor thin film layer 20a.

The active layer 16 has the composition $Al_yGa_{1-y}$As wherein, if the light emission wavelength is 760 nm, y=approx. 0.15, and if the light emission wavelength is 740 nm, y=approx. 0.2. The lower cladding layer 15, the active layer 16 and the upper cladding layer 17 provide a double hetero-junction structure having potential barriers at the hetero epitaxial layer interfaces (for example, the lower cladding, active and upper cladding layers have the Al contents (x) of 0.6, 0.15 and 0.6 in $Al_xGa_{1-x}As$, respectively).

The contact layer 18 is n-type GaAs ($5 \times 10^{17}$–$3 \times 10^{18}$ cm$^{-3}$) and contains a high concentration of impurities in order to obtain ohmic contacts on the n-type side.

The active layer may be divided into an upper and lower layer, wherein the lower active layer is p-type and the upper active layer is n-type.

Further, the lower contact layer 15 and lower cladding layer 16 may be n-type, and the upper cladding layer 18 and upper contact layer may be p-type. In this case, if the active layer is divided into an upper and lower layer, the lower layer is n-type and the upper layer is p-type.

Instead of the above hetero-junction type LED (double hetero or single hetero), a homo-junction type LED may be formed. After the layers have been grown epitaxially, a pn junction is formed in the active layer by diffusion of impurities from the surface of the topmost layer by the solid phase diffusion method. When the pn junction is formed by diffusion of impurities in this way, instead of etching parts other than the light-emitting areas as mentioned above, this diffusion of impurities constitutes an element-isolation step.

The pn junction may also be formed by forming an epitaxial film of the same semiconductor material, and in such a case, a p-type layer and n-type layer may be formed by diffusion or epitaxial growth.

Figure 2:
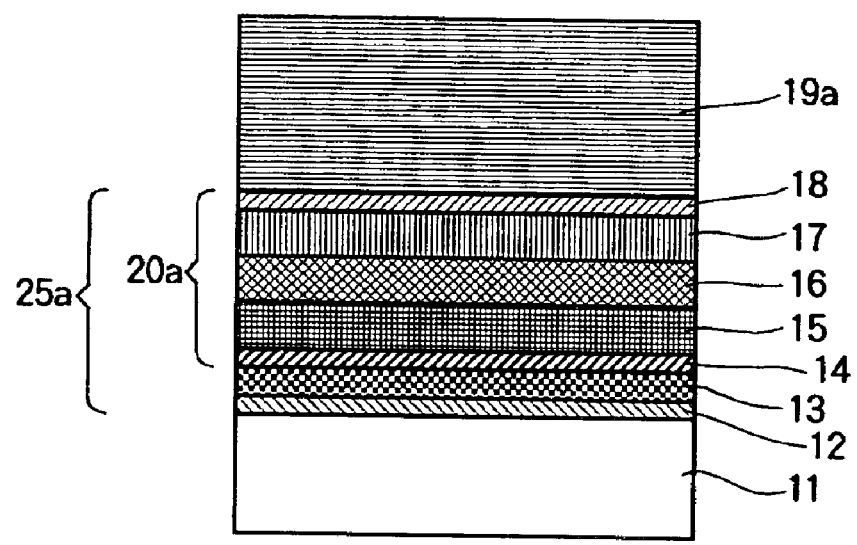
FIG. 2 is a schematic partial cross-sectional view showing the structure obtained by forming a layer of individual support materials on a semiconductor thin film in the manufacturing method according to Embodiment 1 of the present invention.

After the semiconductor epitaxial film layer 25a has been formed as described above, a layer 19a which will become individual support materials is formed thereupon (FIG. 2). Herein, the layer 19a which will become individual support materials may be used also as an etching mask layer which determines the pattern of the semiconductor thin film pieces.

The layer 25a which will become individual support materials is formed of a photoresist material, which is fixed to the semiconductor epitaxial film layer 25a, by applying or affixing to the whole of the semiconductor epitaxial film layer 25a.

Figure 3:
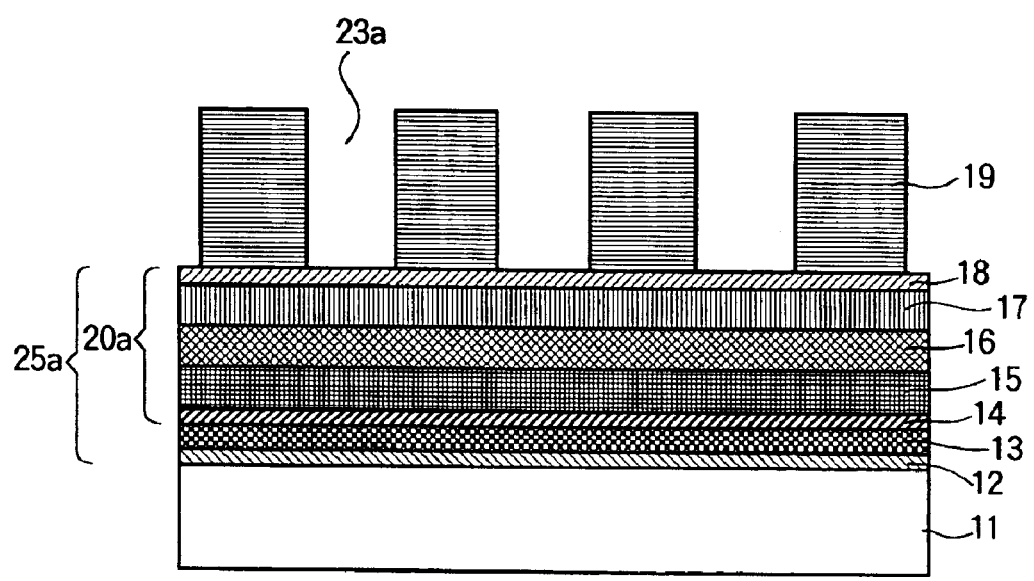
FIG. 3 is a schematic partial cross-sectional view showing the structure obtained by patterning of the individual support material film in the manufacturing method according to Embodiment 1 of the present invention.

Subsequently, the layer 19a is selectively exposed using a photomask, not shown, and patterned by developing, to form individual support materials 19 (FIG. 3). Due to the selective removal of the layer 19a by developing, grooves 23a are formed between the individual support materials 19.

The individual support materials 19 are used as a pattern to determine the shape of the semiconductor thin film pieces 20, as described later, and have an identical pattern to the intended shape of the semiconductor thin film pieces 20. The individual support materials 19 are also used to support the semiconductor thin film pieces 20 when the semiconductor thin film pieces 20 are peeled away from the substrate 11 and affixed to a second substrate (31).

The individual support materials 19 have a thickness of 10 to 200 μm, but more preferably of the order of 25 to 100 μm. From the viewpoint of handling, a larger thickness of the individual support material is better, but the thicker they are the more difficult manufacturing is, so the thickness is therefore limited in these respects.

The material of the individual support materials 19 may for example be an acrylic polymer obtained by copolymerization of methacrylic acid. The Young's modulus ($N/m^2$) of this material is of the order of $5 \times 10^6$ to $1 \times 10^9$, and the Poisson's ratio is of the order of 0.4 to 0.5.

Figure 4:
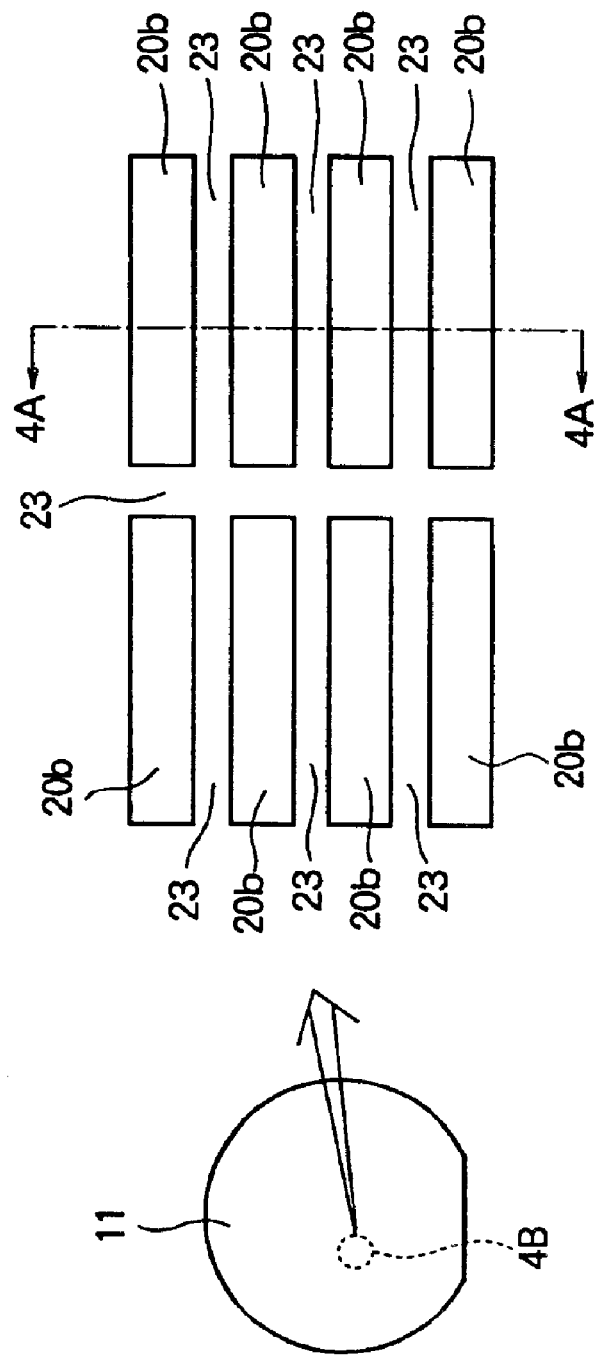
FIG. 4 is a plan view showing the structure obtained by forming grooves in a semiconductor thin film in the manufacturing method according to Embodiment 1 of the present invention.
Figure 5:
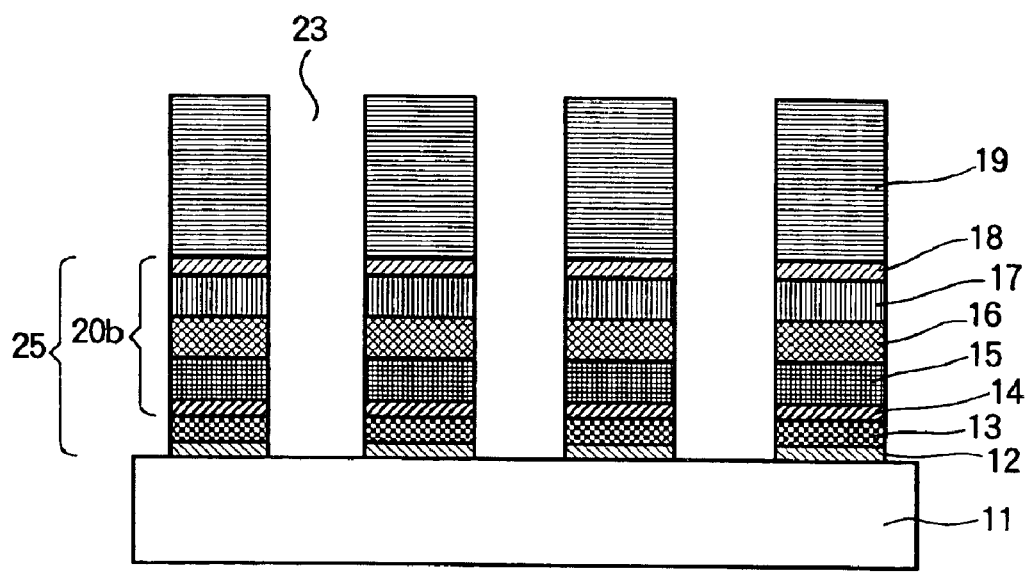
FIG. 5 is a schematic partial cross-sectional view, through a line 4A—4A of FIG. 4, of the structure obtained when the grooves have been formed in the manufacturing method according to Embodiment 1 of the present invention.

Next, the semiconductor thin film layer 20a is divided by the forming grooves 23, by etching using the individual support materials 19 as a mask, so as to form the plurality of semiconductor thin film pieces 20 (FIG. 4 and FIG. 5). FIG. 4 is a plan view. The left-hand side of FIG. 4 shows the whole of the substrate (wafer) 11, and the right-hand side of FIG. 4 is a partial enlargement of an area denoted by the symbol 4B on the left-hand side of FIG. 4. FIG. 5 is a cross-sectional view through a line 4A—4A on the right-hand side of FIG. 4.

In the right-hand part of FIG. 4, only eight of the plurality of island regions 20b of the semiconductor thin film layer on the substrate 11 are shown, and in FIG. 5, only four of the plurality of island regions 20b of the semiconductor thin film layer on the substrate 11 are shown.

The aforesaid etching is performed until at least part of the peeling layer 13 is exposed, i.e., until at least the surface of the peeling layer 13 is exposed, but preferably until division is accomplished by the etching grooves 23. In the example shown in the figure, the etching grooves 23 pass not only through the peeling layer 13 but also through the buffer layer 12 situated underneath it, and reach the surface of the substrate 11. As a result, the epitaxial film layer 25a is also divided into a plurality of epitaxial film pieces 25.

For the etching of the layers 15, 16, 17 formed by AlGaAs or the layers 14, 18 formed by GaAs, the etching solution may for example be a mixture of sulfuric acid, hydrogen peroxide and water ($H_2SO_4$: $H_2O_2$: $H_2$=16:1:1), a mixture of phosphoric acid, hydrogen peroxide and water, or citric acid type etchant.

Regarding the sizes of the island regions 20b of the semiconductor thin film layer (which are also called "chips"), when the island regions of the semiconductor thin film layer form an LED array, their width is approximately 10 μm to 200 μm and their length is approximately 4 mm to 16 mm, but in the case of other applications, the length of the shorter side is within the range of approximately 5 mm or less.

When the width of the etching grooves 23 is narrow, if the surface of the individual support materials 19 is hydrophobic, it may be difficult for the etching solution to penetrate the etching spaces. Therefore, the surface of the individual support materials 19 which are to remain is preferably given a hydrophilic treatment so that the etching solution can smoothly penetrate. For example, it is preferable to give a surface treatment in a low-energy oxygen plasma.

As described above, after forming the etching grooves 23, the etching solution, e.g. 10% hydrofluoric acid (HF) penetrates for example the structure shown in FIG. 5, and performs etching by dissolving or decomposing the peeling layer 13. Herein, in addition to hydrofluoric acid, the etching solution used to etch the peeling layer may be another acid such as hydrochloric acid, hot phosphoric acid or hydrobromic acid. During this etching, the etching solution reaches the peeling layer 13 via the grooves 23. After etching, a water rinse is performed.

Figure 6:
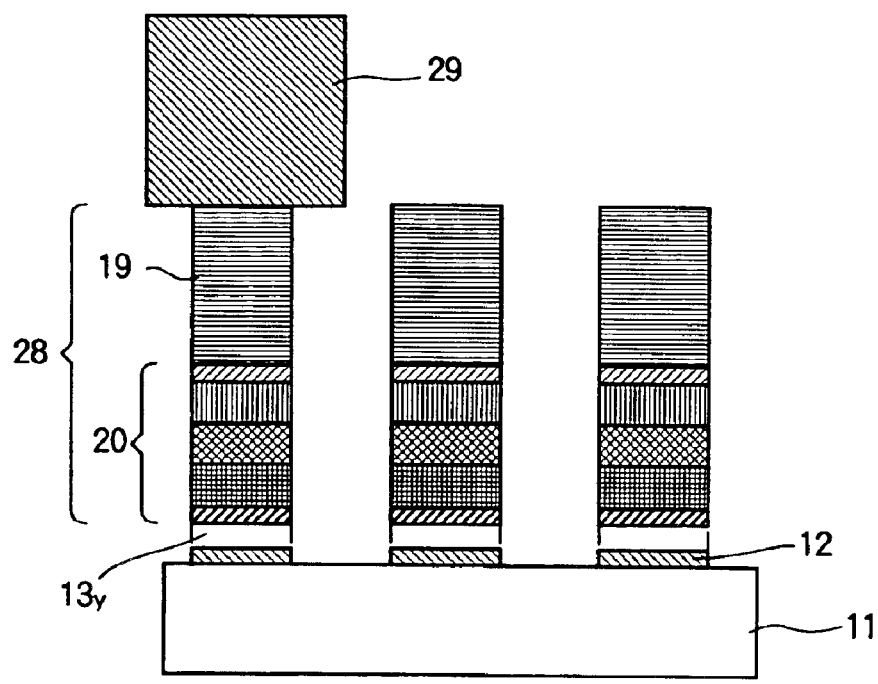
FIG. 6 is a schematic partial cross-sectional view showing the peeling of semiconductor thin film pieces and the individual support materials thereon by a suction tool in the manufacturing method according to Embodiment 1 of the present invention.

Due to this etching, the semiconductor thin film pieces 20 are simply held on the buffer layer 12 by the surface tension of the water, or lie on the buffer layer 12 due to gravity. In this state, as shown in FIG. 6, the individual support materials 19 and semiconductor thin film pieces 20 fixed thereto (for convenience, an assembly comprising one of the individual support materials 19 and one of the semiconductor thin film pieces 20 fixed thereto will be referred to as a "transport piece" 28) are vacuum suctioned using a suction tool 29, and the transport pieces 28 are then separated from the substrate 11. The symbol 13y in FIG. 6 shows the transport pieces 28 have been separated from the buffer layer 12 on the substrate 11 by etching the peeling layer 13.

The suction due to the suction tool 29 is performed by applying suction to the surface (top surface) of the individual support materials 19. As relatively thick individual support materials 19 are provided, suction is easily applied by the suction tool 29, and it does not damage the surface of the upper contact layer 18.

The inventors experimentally verified that, in the step of etching the peeling layer 13 when a resist material was used for the individual support materials 19, if for example a stress was given to the individual support materials 19 by raising or lowering the temperature so as to introduce a difference of thermal expansion between the individual support materials 19 and semiconductor thin film pieces 20, peeling of the semiconductor thin film pieces 20 was easy even if no space was allowed between the semiconductor thin film pieces 20 and the substrate 11. Further, it was found that the etching of the peeling layer 13 was particularly easy when the width of the semiconductor thin film pieces 20 (dimension of the shorter side when the semiconductor thin film pieces 20 are rectangular as shown in the diagram) was as narrow as 500 μm or less, and it was then unnecessary to bend or curve the semiconductor thin film pieces 20 by applying a stress by heating or cooling the etching solution in the etching step described above.

In other words, the manufacturing method of this embodiment is particularly effective when the width of the semiconductor thin film pieces 20 is 500 μm or less.

Figure 7:
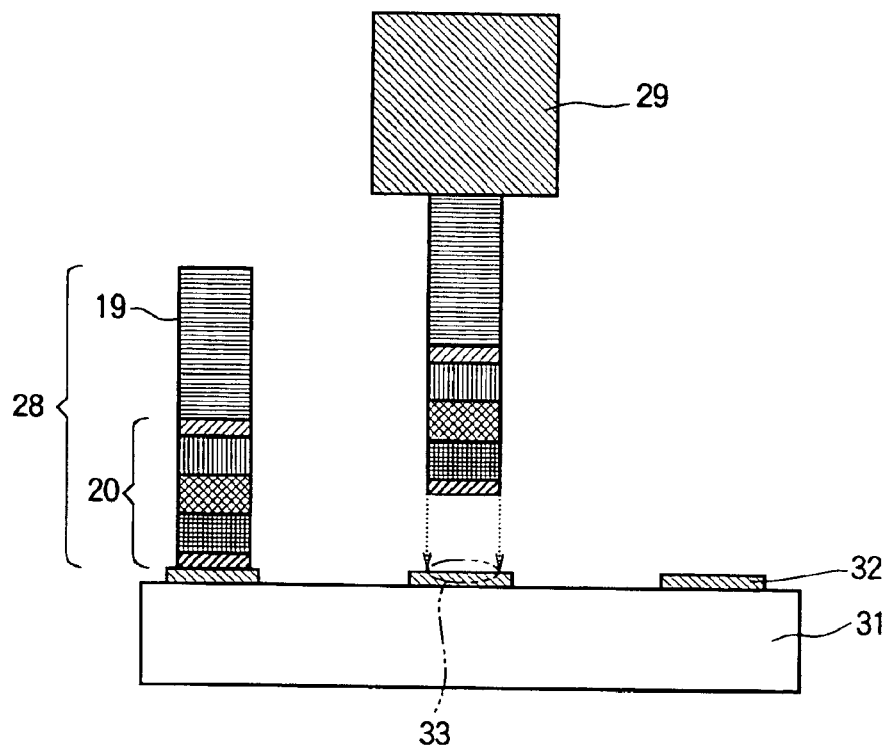
FIG. 7 is a schematic partial cross-sectional view showing the step of affixing the semiconductor thin film pieces and the individual support materials to a second substrate in the manufacturing method according to Embodiment 1 of the present invention.
Figure 8:
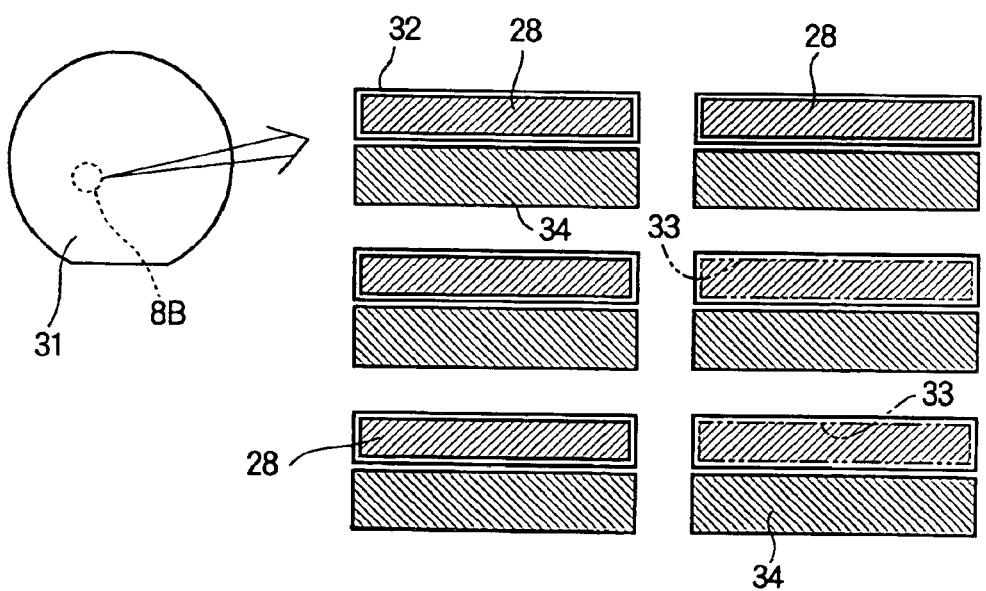
FIG. 8 is a plan view showing the step of affixing the semiconductor thin film pieces and the individual support materials to the second substrate in the manufacturing method according to Embodiment 1 of the present invention.

As described above, the transport pieces 28 to which suction is applied by the suction tool 29 are then affixed (bonded) to the second substrate, e.g., a Si substrate 31, as shown in FIG. 7 and FIG. 8.

As shown in FIG. 7 and FIG. 8, a metal conducting layer 32 having a predetermined pattern for affixing the semiconductor thin film pieces 20 is formed on the second substrate 31 prior to the above affixing step, this conducting layer 32 being connected to a predetermined area of circuit areas 34 in the substrate. The circuit areas 34 in the substrate and the conducting layers 32 are arranged so that they are adjacent to each other.

FIG. 8 is a plan view of the second substrate 31. The left-hand side of FIG. 8 shows all of the substrate (wafer), and the right-hand side of FIG. 8 shows an enlargement of the part denoted by the symbol 8B on the left-hand side of FIG. 8. FIG. 8 shows only six of the plurality of conducting layers 32 on the substrate 31, the transport pieces 28 having been affixed to four of them, leaving two to which the transport pieces 28 have not been affixed. In FIG. 8, the symbol 33 shows the area where the transport pieces 28 are intended to be fixed. This intended area 33 is formed within the area of the conducting layer 32.

The circuits in the substrate circuit areas 34 are connected to circuits or elements in the semiconductor thin film pieces 20 affixed to the conducting layers 32 adjacent to the areas 34, and function together therewith. For example, an array of driven elements such as an array of light-emitting elements are formed in the semiconductor thin film pieces 20, and driving circuits for driving the light-emitting elements are formed in the circuit areas 34 in the substrate. A composite semiconductor device is thereby formed from the combination of the light-emitting element array in the semiconductor thin film pieces 20 and the circuits in the substrate circuit areas 34.

The conducting layers 32 are used not only for affixing the semiconductor thin film pieces 20, but also to connect the circuits in the substrate circuit areas 34 to the circuits or elements in the semiconductor thin film pieces 20. The circuits in the substrate circuit areas 34 and the circuits or elements in the semiconductor thin film pieces 20 are connected by metal layer wiring which is formed by photolithographic fabrication process.

During affixing of the semiconductor thin film pieces 20 to the conducting layer 32, the lower contact layer 14 of the semiconductor thin film pieces 20 is stuck or bonded to the surface of the conducting layer 32. The bonding energy between the semiconductor thin film pieces (the surfaces of the lower contact layer 14) and the conducting layers 32 (the conducting layer surfaces) arises from the intermolecular attractive force (Van der Waals force); post-bonding annealing will provide atomic rearrangement at the bonded interface and higher bonding energies.

After the transport pieces 28 have been affixed to all the plurality of, or a predetermined ones of, conducting layers 32 on the second substrate 31, the substrate 31 is heated to, for example, approximately 200° C. so as to obtain a strong adhesive force (bonding force).

Figure 9:
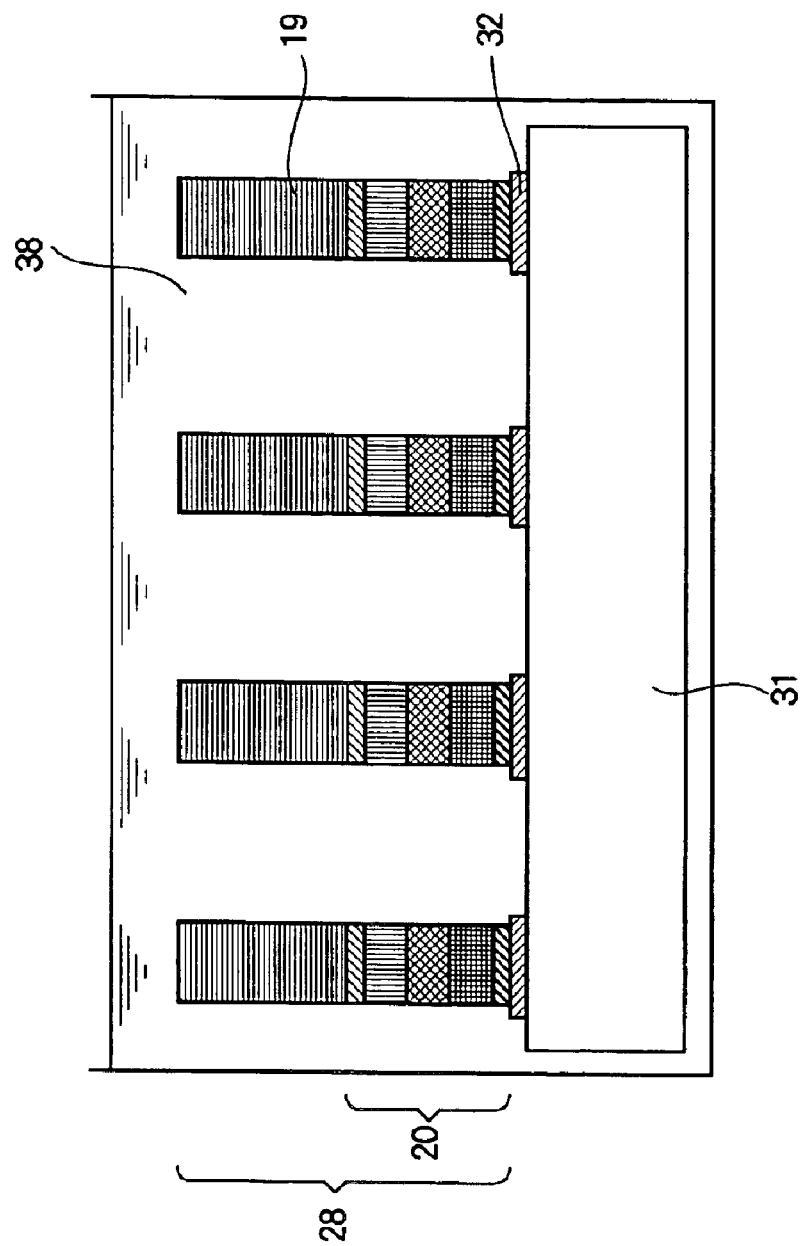
FIG. 9 is a schematic partial cross-sectional view showing the step of removing the individual support materials in the manufacturing method according to Embodiment 1 of the present invention.

After the fixing process is complete, the substrate 31 with the transport pieces 28 affixed to it is immersed in a peeling agent (removing agent) 38, to remove the individual support materials 19 (FIG. 9).

The peeling agent 38 peels (removes) the individual support materials 19 away from the semiconductor thin film pieces 20, or dissolves or decomposes the individual support materials 19, and is a chemical material which does not affect the semiconductor thin film pieces 20. For example, a solution containing an organic alkali, a solution containing an organic amine, or an organic solvent containing acetone or xylene, can be used.

Figure 10:
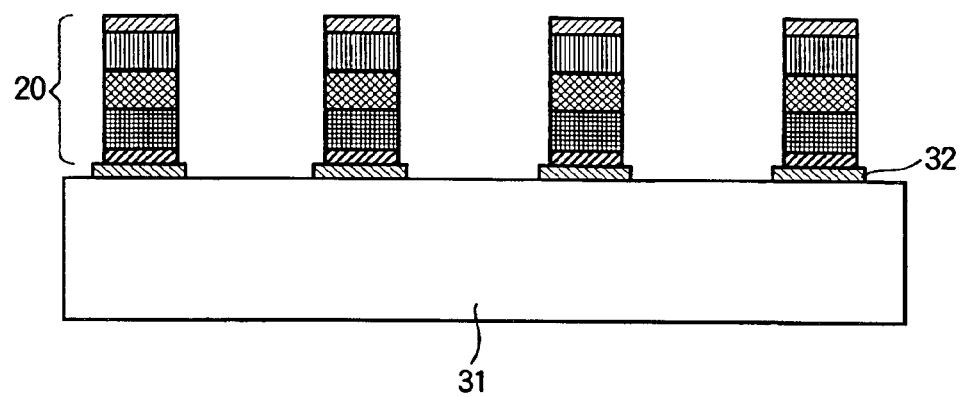
FIG. 10 is a schematic partial cross-sectional view showing the structure obtained when the individual support materials have been removed in the manufacturing method according to Embodiment 1 of the present invention.

FIG. 10 schematically shows a cross-section through the structure obtained after removing the individual support materials 19.

Subsequently, the circuits or elements in the semiconductor thin film pieces 20 shown in FIG. 10 are formed. In this step, thin film-forming techniques used to form a dielectric thin film or metal thin film, or photolithography/etching techniques, which are known in the art, are applied to isolate the elements of the semiconductor thin film, form an interlayer insulating film and form interconnections. Next, the devices in the semiconductor thin film pieces 20 and the circuits in the substrate circuit areas 34 adjacent to the semiconductor thin film pieces are connected by the interconnection, pattern formed by the metal thin film, and the composite semiconductor device comprising the semiconductor thin film pieces 20 and circuits in the substrate circuit areas 34 is thereby complete. A further step may be provided to furnish a protective film such as a passivation film or the like.

In the aforesaid manufacturing method of Embodiment 1, when the semiconductor thin film provided on the first substrate is peeled away (lifted off) from the first substrate, the step is provided to divide the semiconductor thin film into a plurality of island regions of the semiconductor thin film layer prior to the step of peeling the semiconductor thin film, and the etching mask provided on the semiconductor thin film in the step of dividing it into semiconductor thin film pieces remains after the etching step, so it can be used as a support material for the semiconductor thin film pieces after the step of peeling (lifting off) the semiconductor thin film pieces. Therefore, the semiconductor thin film pieces can be peeled (lifted off), transported and affixed (bonded) to the second substrate using the semiconductor thin film pieces and the support materials which are self-aligned with them, so it can be handled without causing damage such as defects and cracks in the semiconductor thin film pieces.

In the step of peeling the semiconductor thin film pieces, since the support materials are not provided separately so that they conform to the semiconductor thin film pattern, there is no risk of the peeling layer underneath the semiconductor layer being covered by the support material due to misalignment between the semiconductor thin film pattern and the support material pattern, or peeling or etching errors associated with misalignment of the support materials to the island regions of the semiconductor thin film layer.

Further, by detecting the support material pattern which is self-aligned with the semiconductor thin film pieces, the semiconductor thin film pieces and areas for affixing the semiconductor thin film pieces can be correctly positioned, so fixing can be performed with a high-precision positioning of the semiconductor thin film pieces and affixing areas.

The individual support materials 19 may also be formed of a material other than a resist having photosensitive properties, e.g., a liquid wax, liquid ink or an organic material such as a polymer having photosensitive properties. The organic material used for the support materials may be formed by various methods such as spin coating, printing, application, sticking and pattern transfer. By using an organic material for the support materials, various steps can be efficiently performed from the viewpoints of patterning in the step of forming the support material pattern, etching speeds in the step of peeling the semiconductor thin film pieces and adhesion of the support materials to the surface of the semiconductor thin film pieces in the step of peeling the semiconductor thin film pieces, strength of the support materials in the step of transporting and affixing the semiconductor thin film pieces, and removability of the support materials from the semiconductor thin film pieces in the step of peeling (removing). Apart from an organic material, the individual support materials 19 may be also metal material which can withstand the etching solution used for example in forming the support material pattern or peeling the semiconductor thin film pieces.

The individual support materials 19 are preferably formed of material which is not etched by the etching solution used for peeling the peeling layer 13 (i.e., wherein the etching rate is much lower than the etching rate of the peeling layer 13 due to this etching solution).

Embodiment 2

The manufacturing method-according to Embodiment 2 of the invention has the feature that, in addition to the individual support materials 19 of Embodiment 1, a connecting support material 39 is used.

In the manufacturing method according to Embodiment 2, the structure shown in FIG. 5 is obtained in a manner which is identical to that described for Embodiment 1.

Figure 11:
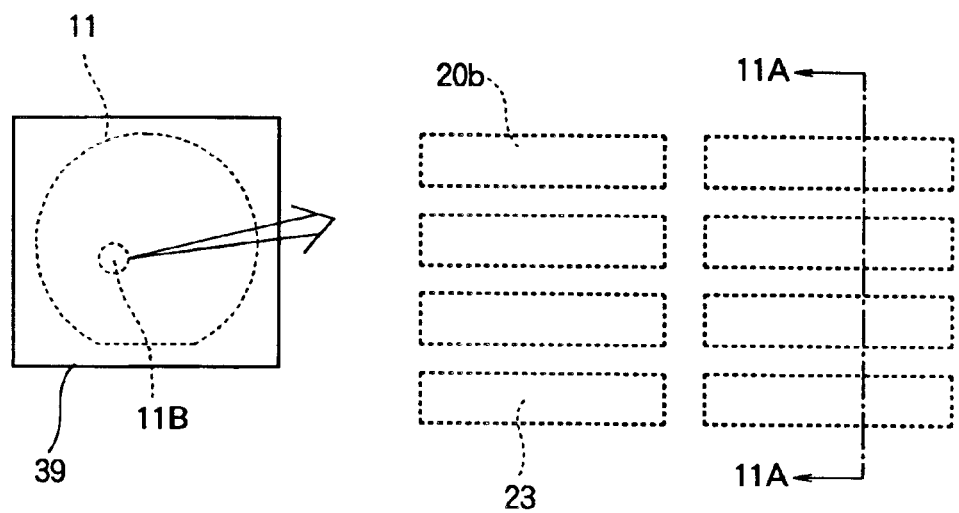
FIG. 11 is a plan view showing a structure obtained when a connecting member has been formed in the manufacturing method according to Embodiment 2 of the present invention.
Figure 12:
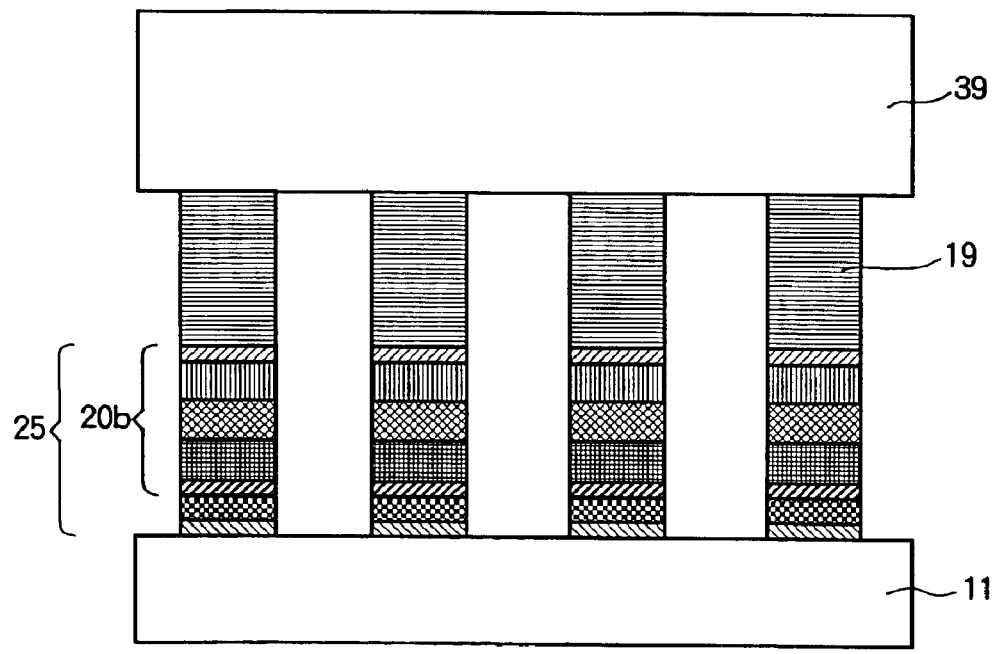
FIG. 12 is a schematic partial cross-sectional view through a line 11A—11A of FIG. 11 showing a structure obtained when the connecting member has been formed in a manufacturing method according to Embodiment 2 of the present invention.

Next, as shown in FIG. 11 and FIG. 12, a connecting support material 39 which supports the plurality of individual support materials 19 on the substrate 11 is formed. In the example shown in the figure, all the individual support materials 19 on the substrate 11 are connected. FIG. 11 is a plan view. The left-hand side of FIG. 11 shows the whole of the substrate (wafer) 11, and the right-hand side of FIG. 11 is a partial enlargement of the area shown by the symbol 11B on the left-hand side of FIG. 11. FIG. 12 is a cross-sectional view through a line 11A—11A on the right-hand side of FIG. 11.

In the right-hand part of FIG. 11, only eight of the plurality of semiconductor thin film pieces 20 on the substrate 11 are shown, and in FIG. 12, only four of the plurality of semiconductor thin film pieces 20 on the substrate 11 are shown.

The connecting support material 39 is attached (bonded) to the upper surfaces of the plurality of the individual support materials with adhesives on the connecting supporting material 39. The connecting support material 39 may for example be a sheet (polymer sheet) containing an organic material, porous substrate, a transparent substrate such as a sapphire or a quartz, a Si substrate, a metal substrate or a metal substrate coated with a polymer material (e.g., polyimide). The connecting support material 39 may be flexible or rigid. It may be a continuous body, or may be mesh, wire or combination of these various configurations. The connecting support material 39 may be stuck to the individual support materials 19 by stickiness of the surface of the connecting support material; adhesive, tacky-adhesive or resist stickiness provides stickiness. The adhesive, tacky-adhesiveness or resist material may be applied to the substrate of the connecting support material in advance. The adhesive may be an acrylic type or epoxy type adhesive, such as an adhesive having UV (ultraviolet) curing properties or thermosetting properties. The adhesive, tacky-adhesiveness may have repeat release properties, UV release properties or heat release properties.

Figure 13:
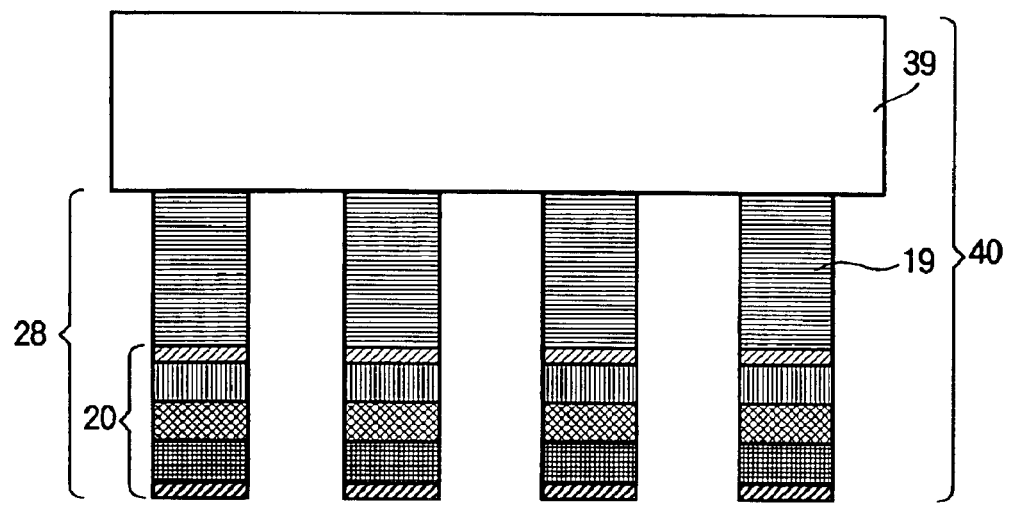
FIG. 13 is a schematic partial cross-sectional view showing a state wherein a plurality of individual support materials connected by a connecting support material and semiconductor thin film pieces have been peeled away from a first substrate in the manufacturing method according to Embodiment 2 of the present invention.

The connecting support material 39 is formed as shown in FIG. 11 and FIG. 12. Next, as shown in FIG. 13, as in Embodiment 1, the peeling layer 13 is etched away, and a structure 40 wherein a plurality of transport pieces (each comprising an assembly of one of the individual support materials 19 and one of the semiconductor thin film pieces 20 attached thereto) are supported by the connecting member (connecting support material) 39, is peeled away from the substrate 11.

Figure 14:
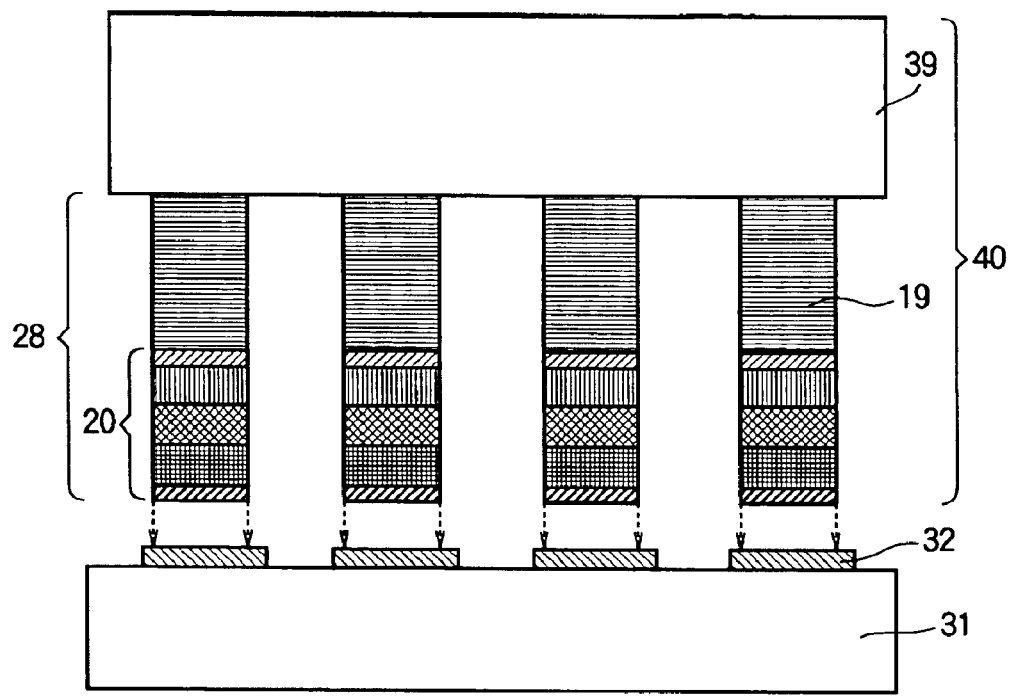
FIG. 14 is a schematic partial cross-sectional view showing the step of affixing the plurality of individual support materials connected by the connecting support material and semiconductor thin film pieces to a second substrate in the manufacturing method according to Embodiment 2 of the present invention.
Figure 15:
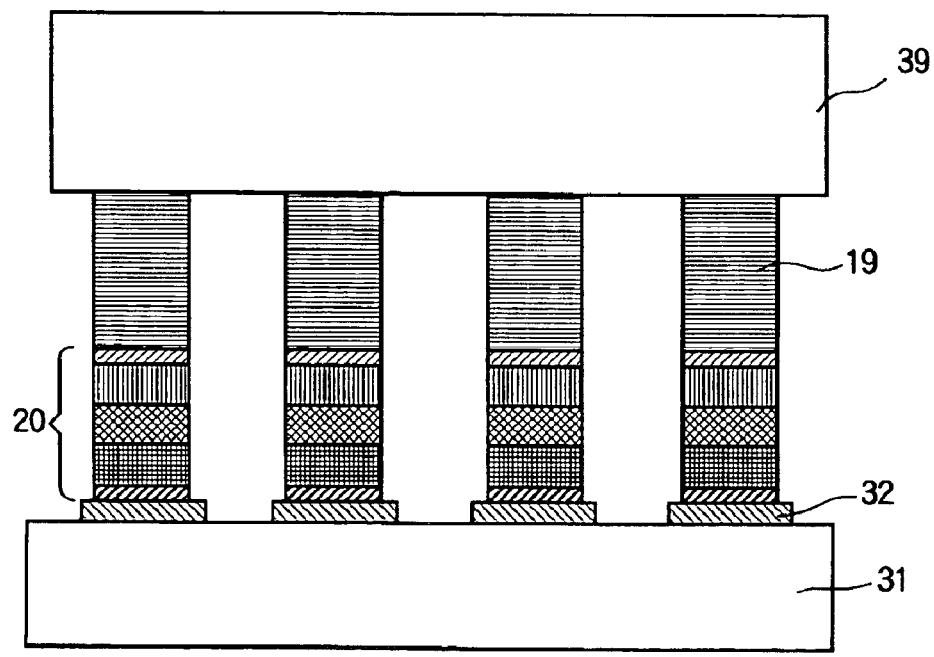
FIG. 15 is a schematic partial cross-sectional view showing a structure obtained when the plurality of individual support materials connected by the connecting support material and semiconductor thin film pieces have been stuck to the second substrate in the manufacturing method according to Embodiment 2 of the present invention.

Next, as shown in FIG. 14 and FIG. 15, the plurality of transport pieces 28 of the structure 40 are affixed to a predetermined area on the second substrate 31. Specifically, the lower contact layer 14 of the semiconductor thin film pieces 20 is bonded by intermolecular force to the conducting layer 32 provided on the second substrate 31. The bonding energy between the semiconductor thin film pieces (the surfaces of the lower contact layer 14) and the conducting layers 32 (the conducting layer surfaces) arises from the intermolecular attractive force (Van der Waals force); post-bonding annealing will provide atomic rearrangement at the bonded interface and higher bonding energies. During the bonding step, suitable pressure and heat are applied so that, at least in the subsequent support removal step, sufficient fixing strength (large bonding energy) is obtained and the semiconductor thin film pieces 20 are not detached from the bonded area.

Figure 16:
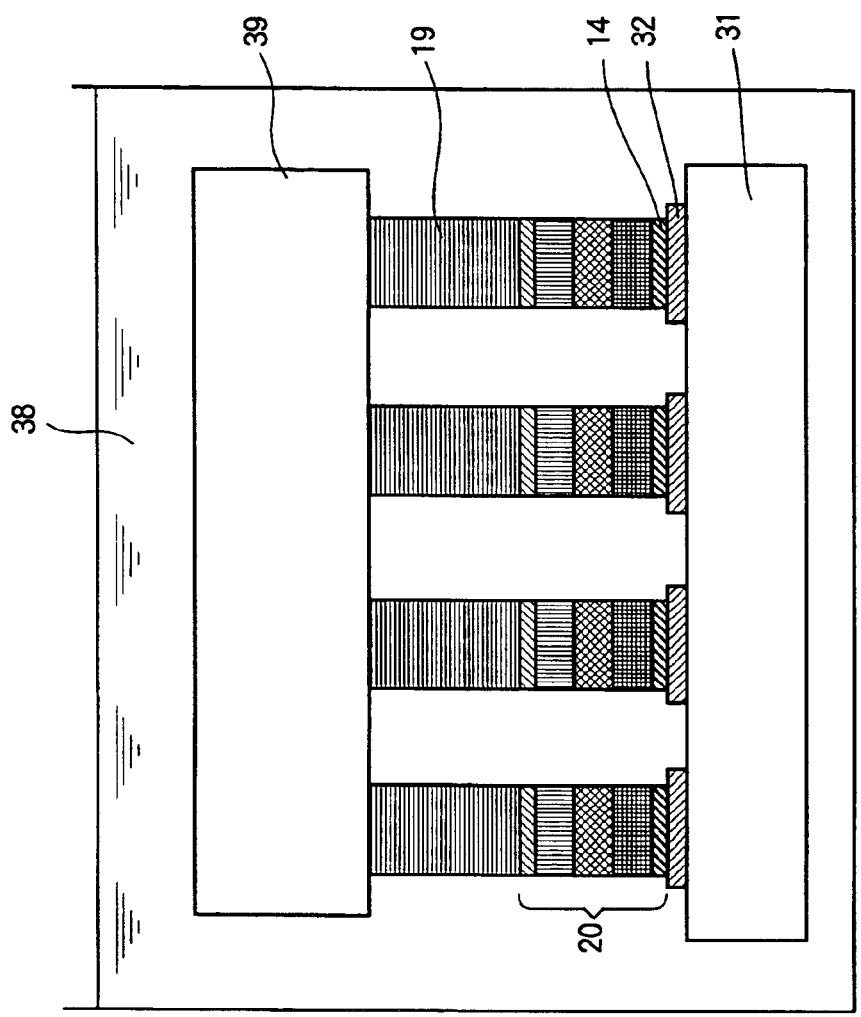
FIG. 16 is a schematic partial cross-sectional view showing the step of removing the connecting support material and individual support materials in the manufacturing method according to Embodiment 2 of the present invention.
Figure 17:
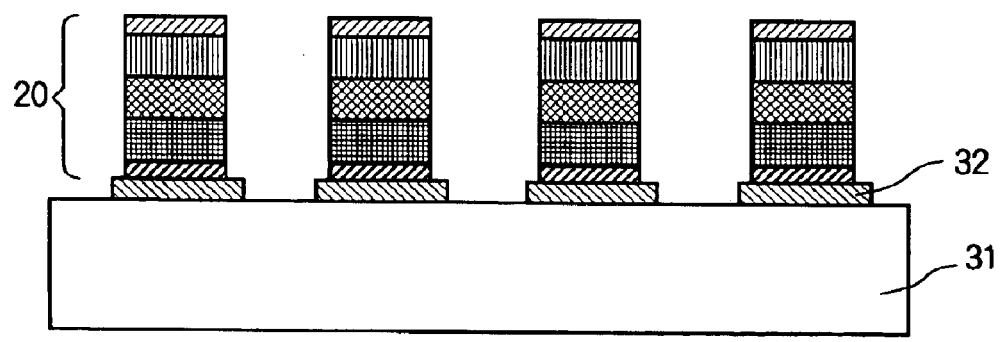
FIG. 17 is a schematic partial cross-sectional view showing a structure obtained when the connecting support material and individual support materials have been removed in the manufacturing method according to Embodiment 2 of the present invention.

Next, as shown in FIG. 16, the structure shown in FIG. 15 is immersed in a peeling agent 38 which dissolves or decomposes the individual support materials 19, to remove the individual support materials 19 and connecting support material 39, and leave a structure wherein the plurality of semiconductor pieces 20 remain fixed to the substrate 31, as shown in FIG. 17.

As described above, a suitable annealing step will provide higher bonding energy at the bonded interface; the semiconductor thin film pieces will be much strongly bonded to the bonded area.

According to Embodiment 2, in addition to the individual support materials 19 provided on the semiconductor thin film pieces 20, the connecting support material 39 which connects the support materials 19 is provided, so in the step wherein the semiconductor thin film pieces 20 are peeled away from the first substrate 11, the plurality of semiconductor thin film pieces 20 can be peeled off (lifted off) all at once, and in the step wherein the semiconductor thin film pieces 20 are affixed to the second substrate 31, the plurality of semiconductor thin film pieces 20 can be affixed all at once. Fixing or bonding can be performed without picking up each of the semiconductor thin film pieces 20 individually, so handling of the semiconductor thin film pieces 20 is even easier. Moreover, fixing is performed in a state wherein the positional relationships of the semiconductor thin film pieces are maintained, so positioning for fixing can be performed easily and with high precision.

Embodiment 3

In Embodiment 2, the connecting support material extended over the whole surface of the substrate (wafer) 11. However, connecting support materials each of which covers only a part of the substrate 11 and connects a plurality of individual support materials 19 may be used. In other words, the substrate 11 may be divided into a plurality of areas, and a plurality of connecting support materials 39 which respectively cover the divided areas may be provided.

Figure 18:
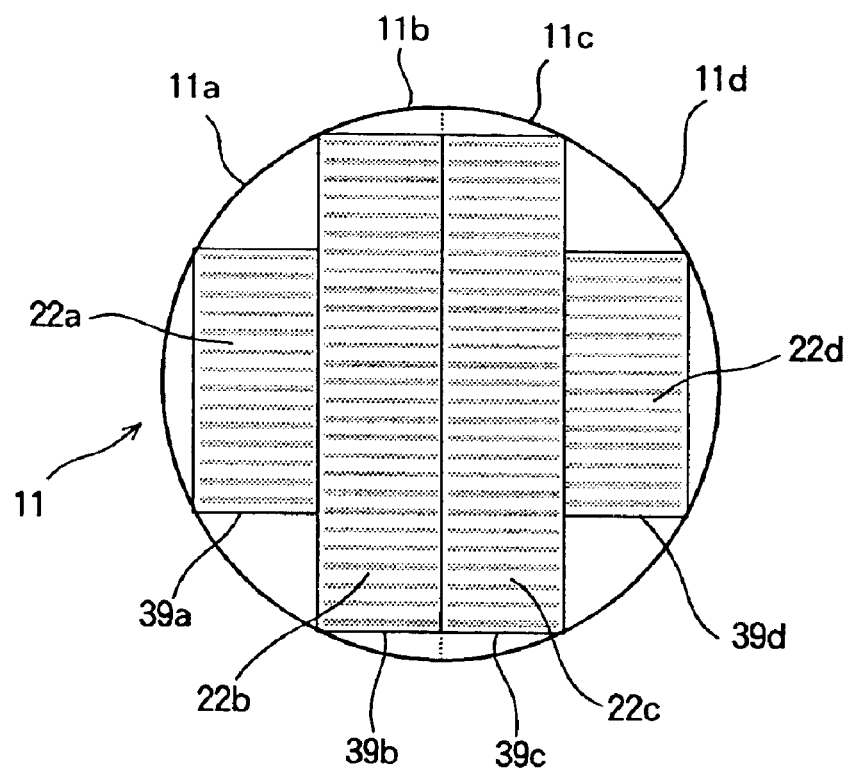
FIG. 18 is a schematic plan view showing a plurality of connecting support materials provided in a plurality of divided areas of a first substrate in a manufacturing method according to Embodiment 3 of the present invention.

In FIG. 18, the substrate 11 is divided into four areas. That is, in the illustrated example, the substrate 11 is divided into four areas 11a, 11b, 11c, 11d, and using each of four connecting support materials 39a, 39b, 39c, 39d which connect the individual support materials 19 of groups 22a, 22b, 22c, 22d of the plurality of semiconductor thin film pieces 20 on these areas, each of the groups 22a, 22b, 22c, 22d of the plurality of semiconductor thin film pieces 20 on these areas 11a, 11b, 11c, 11d are peeled away from the substrate 11 all at once, are then affixed to the second substrate 31 (each group of the semiconductor thin film pieces supported by the connecting support material is bonded to the respective bonding area on the second substrate 31), as shown in FIG. 19.

Figure 19:
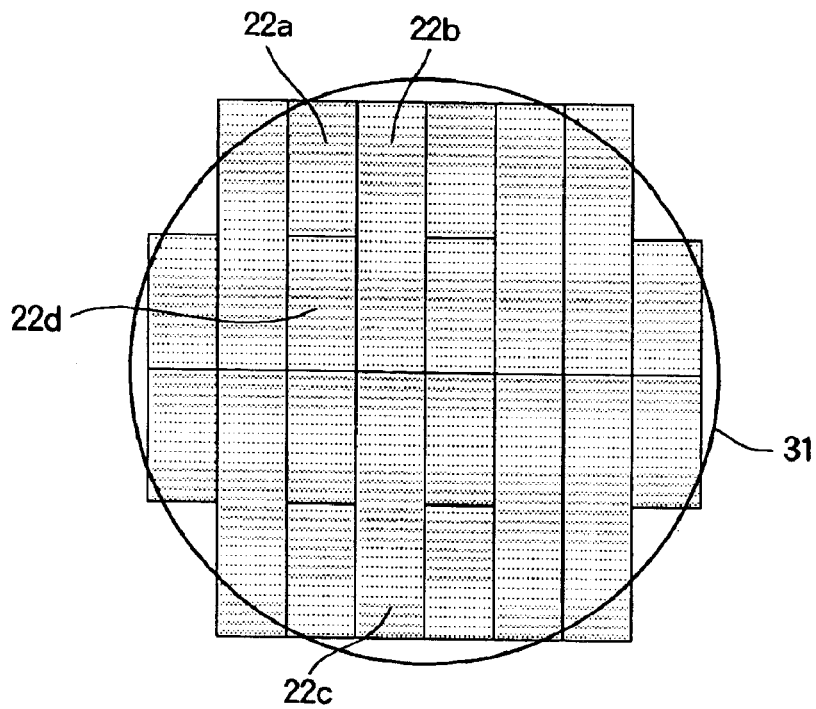
FIG. 19 is a schematic plan view showing the rearrangement on a second substrate, of semiconductor thin film pieces on the first substrate, in the manufacturing method according to Embodiment 3 of the present invention.

In the example of FIG. 19, the substrate 31 has a larger diameter than that of the substrate 11, and the groups 22a, 22b, 22c, 22d of the semiconductor thin film pieces 20 on the substrate 11 are re-positioned or rearranged for fixing to the substrate 31.

Herein, "rearrangement" means, as shown in FIG. 19, that the relative positions of the groups 22a, 22b, 22c, 22d of the semiconductor thin film pieces 20 bonded on the second substrate 31 differ from the relative positions of the same groups 22a, 22b, 22c, 22d of the semiconductor thin film pieces 20 on the substrate 11.

Figure 20:
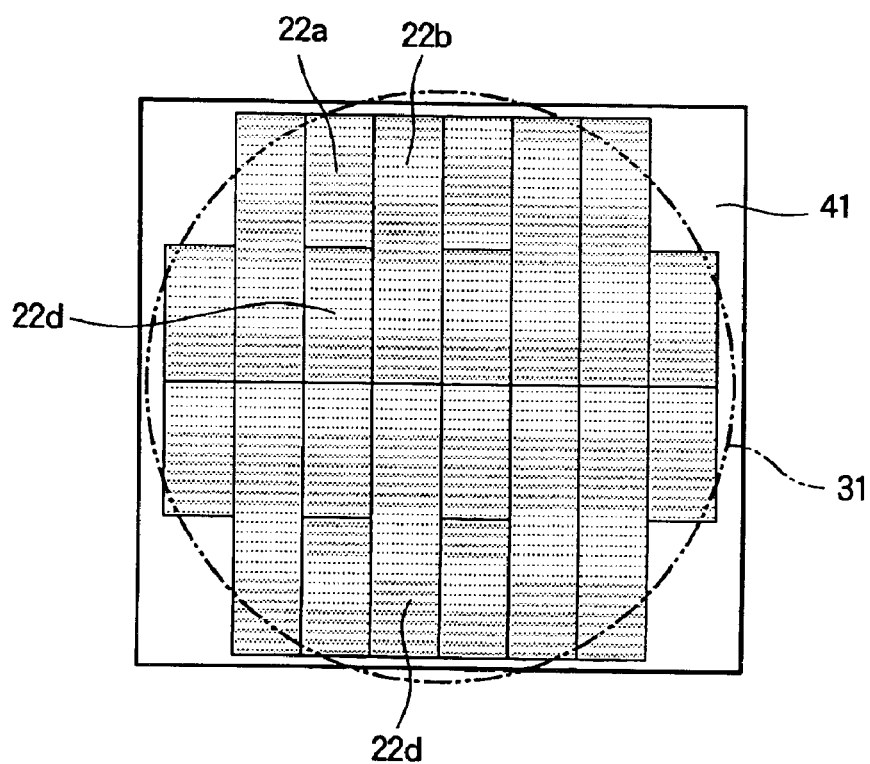
FIG. 20 is a schematic plan view showing a rearrangement substrate used when a plurality of semiconductor thin film pieces on the first substrate, are rearranged on the second substrate, in a modification of the manufacturing method according to Embodiment 3 of the present invention.

In performing such a rearrangement, as shown in FIG. 20, the connecting support materials 39a, 39b, 39c, 39d and the transport pieces 28 (each comprising an assembly of one of the individual support materials 19 and one of the semiconductor thin film pieces 20 attached thereto) connected (supported) by them may be once fixed to a rearrangement substrate 41, and then transferred to the second substrate all at once. In the example shown in FIG. 20, the size of the rearrangement substrate 41 is roughly equivalent to that of the second substrate 31, and after all of the semiconductor thin film pieces 20 to be transferred to the second substrate 31 have been fixed to this rearrangement substrate 41, all of the semiconductor thin film pieces 20 on the rearrangement substrate 41 are then affixed to the second substrate 31 at once.

Alternatively, the groups of semiconductor thin film pieces 20 connected (attracted or bonded) to different connecting support materials 39 may be affixed to different substrates 31.

In the aforesaid example, the plurality of connecting support materials 39a, 39b, 39c, 39d were prepared in advance. However, alternatively, a single connecting support material 39 may be provided for the entirety of the first substrate (wafer) 11 and stuck to all the individual support materials 19 on the substrate 11, all of the semiconductor thin film pieces 20 peeled away from the substrate 11 at once, and then the connecting support material 39 is divided by cutting so as to form assemblies each comprising one of the plurality of connecting support materials (corresponding to 39a, 39b, 39c, 39d) and the plurality of transport pieces 28 connected thereto.

According to Embodiment 3, transfer of the semiconductor thin film pieces to a substrate of different diameter can be smoothly accomplished. Further, by the use of the rearrangement substrate, fixing to a substrate of different diameter can be performed all at once.

Embodiment 2 and Embodiment 3 can be modified in various manners. For example, instead of using the above procedure to remove the support materials 19 and 39, the following technique may be used. Specifically, in the above-described embodiments 2 and 3, after the structure shown in FIG. 15 is obtained, and while the individual support materials 19 are still connected to the connecting support material 39, as shown in FIG. 16, the individual support materials 19 are immersed in a solution (peeling agent 38) to decompose or dissolve them. Alternatively, after the structure shown in FIG. 15 is obtained, the connecting support material 39 may be peeled off first, utilizing heat release properties or UV release properties, or a solution which dissolves the tacky-adhesive agent of the connecting support material 39, e.g., a solution such as acetone, xylene or an aqueous solution of tetramethylammonium hydroxide, and the individual support materials 19 may then be removed by a solution (the peeling agent 38) which decomposes or dissolves the individual support materials 19, as shown in FIG. 9.

Figure 21:
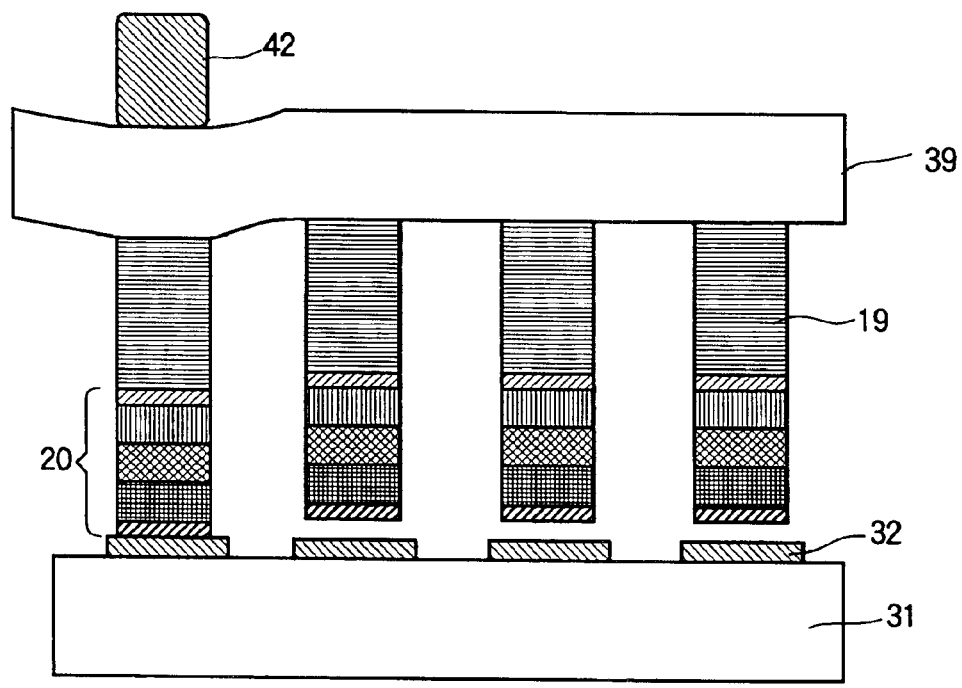
FIG. 21 is a diagram showing the individual fixing of the semiconductor thin film pieces by means of a bonding head according to a modification of Embodiment 2 and Embodiment 3 of the present invention.
Figure 22:
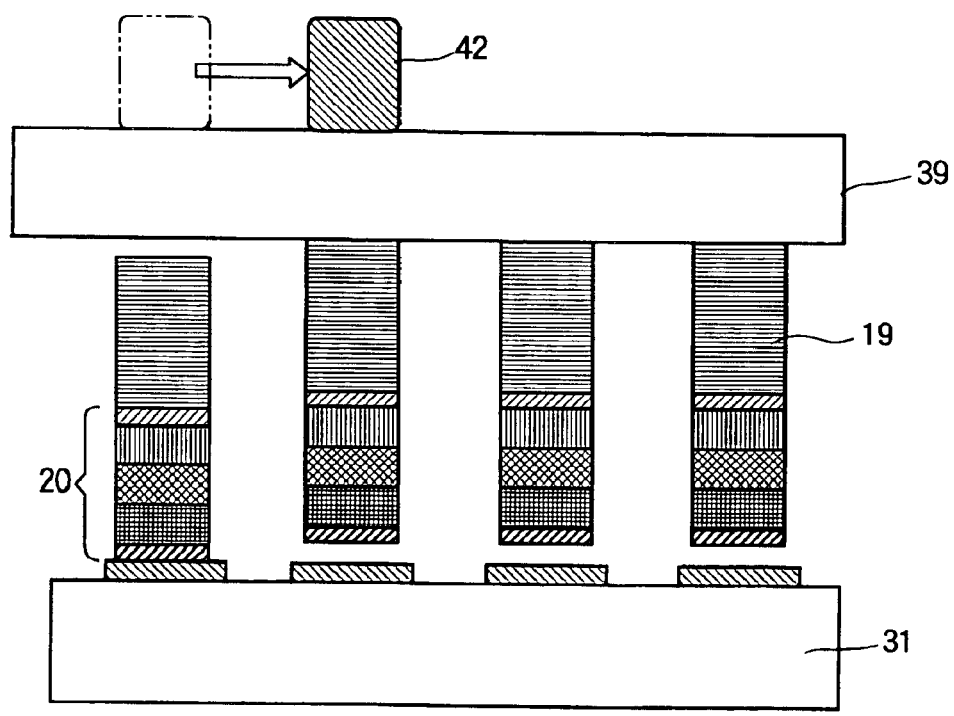
FIG. 22 is a diagram showing the individual affixing of the semiconductor thin film pieces by means of the bonding head according to the modification of Embodiment 2 and Embodiment 3 of the present invention.

In Embodiment 2, as was described referring to FIG. 14 and FIG. 15, the group of semiconductor thin film pieces 20 are affixed to the second substrate 31 all at once. As an alternative, the semiconductor thin film pieces may be affixed to the second substrate 31 by a bonding head 42 which can bond the semiconductor thin film pieces 20 individually, as shown in FIG. 21 and FIG. 22. The bonding head 42 may be equipped with a heating system or a light (UV) exposure system to perform heat release or light exposure release.

Figure 23:
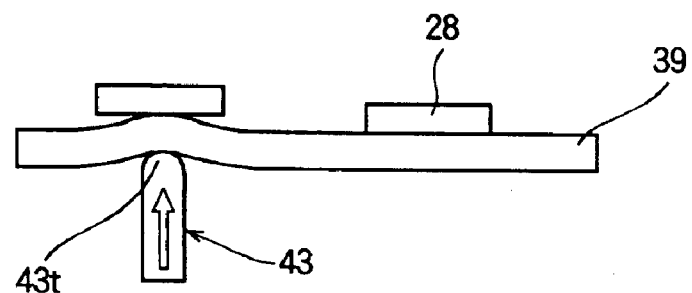
FIG. 23 is a diagram showing the separation of transport pieces (an assembly of a semiconductor thin film piece and an individual support material) from a connecting support material according to another modification of Embodiment 2 and Embodiment 3 of the present invention.

The release of the individual support material 19 from the connecting support material 39 may be accomplished also by mechanical release using a die ejector (see FIG. 23). The die ejector has a convex dome at the top so as not to break the transport pieces 28. The die ejector pushes the region on the connecting support material just below the transport pieces 28 to be bonded; the transport pieces 28 are released easily from the connecting support material using the die ejector.

Figure 24:
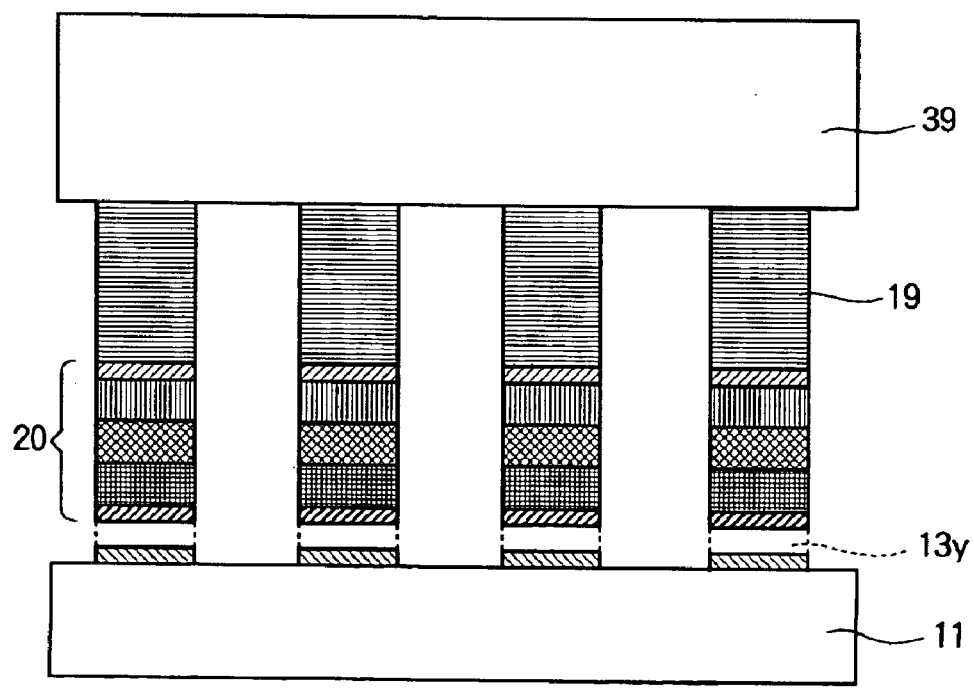
FIG. 24 is a schematic partial cross-sectional view showing the removal of a peeling layer and connection by a connecting support material performed subsequently according to yet another modification of Embodiment 2 and Embodiment 3 of the present invention.

In Embodiment 2, after the grooves were formed in the semiconductor thin film layer 20a to form island regions of the semiconductor thin film layer as shown in FIG. 5, the connecting member 39 was formed before the etching of the peeling layer 13 (FIG. 6) as shown in FIG. 12 and the peeling layer 13 was then etched as shown in FIG. 13. Alternatively, after the structure shown in FIG. 5 is obtained, the peeling layer 13 may be etched and rinsed with water, and the connecting member 39 are then attached or bonded by adhesion or tacky-adhesion to the individual support materials 19 while the semiconductor thin film pieces 20 are held on the substrate 11 by the surface tension of the DI water, or the like, as shown in FIG. 24.

The subsequent treatment is identical to that described for Embodiment 2.

The connecting support material 39 may for example be a sheet (polymer sheet) containing an organic material, a porous substrate, a transparent substrate such as a sapphire or a quartz, a Si substrate, a metal substrate or a metal substrate coated with a polymer material such as a polyimide. The connecting support material 39 may be a material having flexibility or a rigid material without flexibility. It may be a continuous body, or may be mesh, wire or rod, or combinations of these various configurations. The connecting body (the connecting support material) 39 may be stuck to the individual support materials 19 by a material having adhesive property such as an adhesive, tacky-adhesive or resist material. The adhesive, tacky-adhesive or resist material may be applied to the substrate of the connecting support material in advance. The adhesive may be an acrylic type or epoxy adhesive, such as an adhesive having UV curing properties or thermosetting properties. The tacky-adhesive may have repeat release properties, UV release properties or heat release properties.

By providing the organic material having adhesive property between the connecting support material and individual support materials in this way, the connecting support material and individual support materials can be easily and surely stuck together. If the base material of the connecting support material is a polymer sheet such as a polyethylene terephthalate (PET), the connecting support material can be given flexibility, and when the semiconductor thin film pieces are peeled off all at once, a flexible support material may help release easily the semiconductor thin film pieces from the substrate. Hence, even in the case of semiconductor thin film pieces on a wafer of large surface area, they can be peeled off easily all at once.

Further, this connecting support material 39 must not be etched by the etching solution used to etch the peeling layer 13, i.e., the etching rate due to this etching solution must be much lower than the etching rate for the peeling layer 13 due to this solution. In Embodiment 2, the group of semiconductor thin film pieces 20 connected (supported) by the connecting support material 39 were affixed to the conducting layer of the second substrate 31, as shown in FIG. 15. Alternatively, the following technique may be used.

Figure 25:
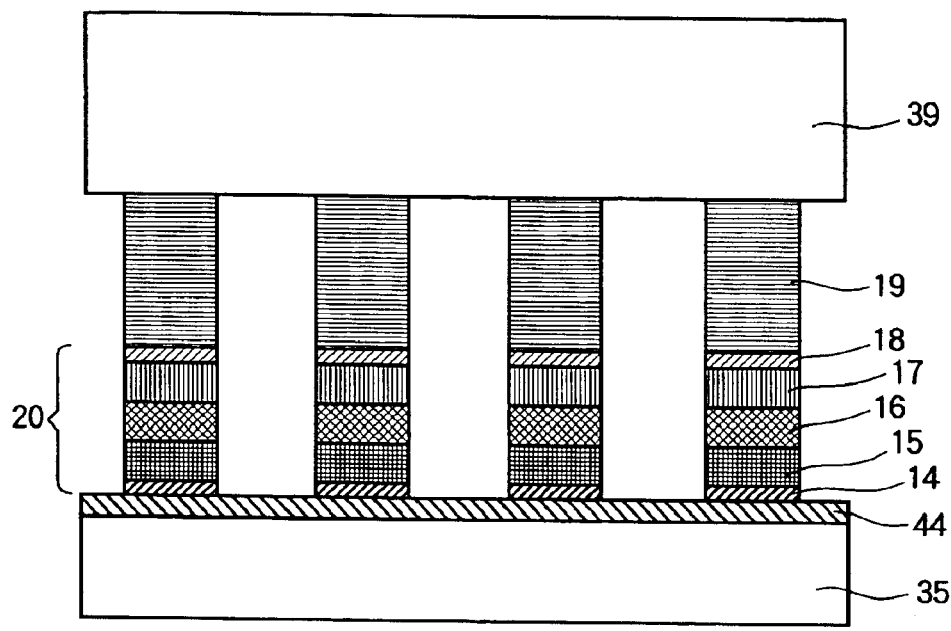
FIG. 25 is a schematic partial cross-sectional view showing temporary installation on a carrier substrate according to a modification of Embodiment 2 of the present invention.

Specifically, as shown in FIG. 25, the group of semiconductor thin film pieces 20 connected (supported) by the connecting support material 39 are temporarily installed on a carrier substrate 35. Herein, the transfer of the semiconductor thin film pieces on the carrier substrate for example can be achieved by providing a layer (temporary adhesion layer) 44 of a coating material which provides an adhesive property such as a resist or a wax. A tacky-adhesive layer having heat release properties or UV release properties, or a tacky-adhesive sheet comprising a tacky-adhesive layer having heat release properties or UV release properties may be provided on the carrier substrate 35, and the group of semiconductor thin film pieces can be temporarily held on the carrier substrate 35. The material used for the temporary adhesion layer 44 is preferably material having resistance to the peeling solution which dissolves or decomposes the individual support materials 19 used in the step of removing the individual support materials 19, described later.

Figure 26:
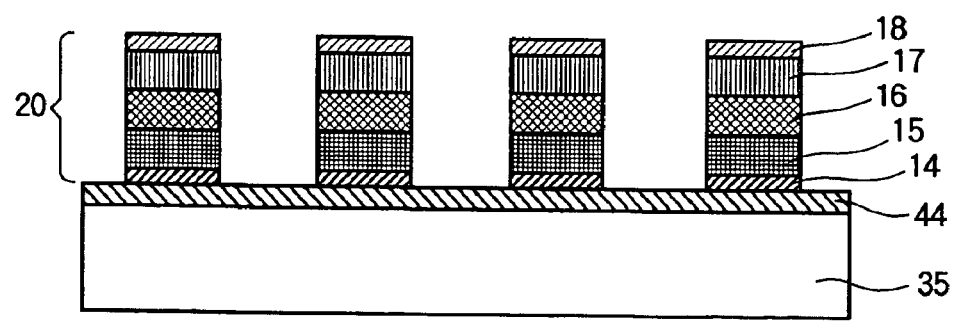
FIG. 26 is a schematic partial cross-sectional view showing removal of the individual support materials and connecting support material from the semiconductor thin film pieces of the transport pieces temporarily installed on the carrier substrate according to the modification of Embodiment 2 of the present invention.

Next, as shown in FIG. 26, the structure is immersed in a solution which dissolves the individual support materials 19 but does not dissolve the temporary adhesion layer 44, to remove the individual support materials 19 and the connecting support material 39. As an example of a combination of the individual support materials 19 and temporary adhesion layer 44, the individual support materials 19 may be wax and the temporary adhesion layer 44 may be resist material. In this case, the temporary adhesion layer is not removed by immersing in xylene, but the individual support materials 19 are dissolved and removed.

Figure 27:
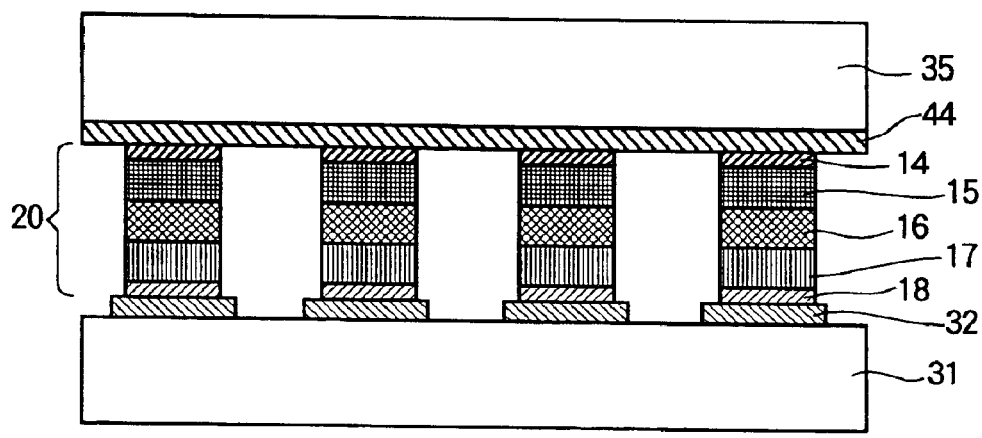
FIG. 27 is a schematic partial cross-sectional view showing the affixing, on a second substrate, of the semiconductor thin film pieces temporarily installed on the carrier substrate according to the modification of Embodiment 2 of the present invention.

Next, the surface of the contact layer 18 of the topmost layer of the semiconductor thin film pieces is cleaned by oxygen plasma treatment, and as shown in FIG. 27, the semiconductor thin film pieces are stuck for example to the second substrate 31 provided with the conducting layer 32 while the semiconductor thin film pieces are supported by the carrier substrate 35. This adhesion treatment is identical to that of Embodiment 1 or Embodiment 2

The following advantages are obtained by this modification. Specifically, the surface fixed to the second substrate 31 is not the lower contact layer 14 of the semiconductor thin film pieces, but the upper contact layer 18. Also, by using not the peeled surface (surface of the lower contact layer 14) exposed by etching the peeling layer 13, but the surface (surface of the upper contact layer 18) manufactured by epitaxial growth protected by the individual support materials 19, as the fixing surface, good adhesion to the second substrate 31 can be obtained even if defects develop in the peeled surface (surface of the lower contact layer 14) in the steps for peeling and transporting the semiconductor thin film pieces.

Further, in Embodiment 2, the peeling layer 13 was etched as shown in FIG. 13, and the group of transport pieces 28 connected (supported) by the connecting support material 39 (the individual support materials 19 connected by the connecting support material 39 and semiconductor thin film pieces 20 supported by them) were peeled off all at once, and the group of semiconductor thin film pieces 20 were then stuck to the second substrate all at once. However, the following procedure may be adopted instead.

Figure 28:
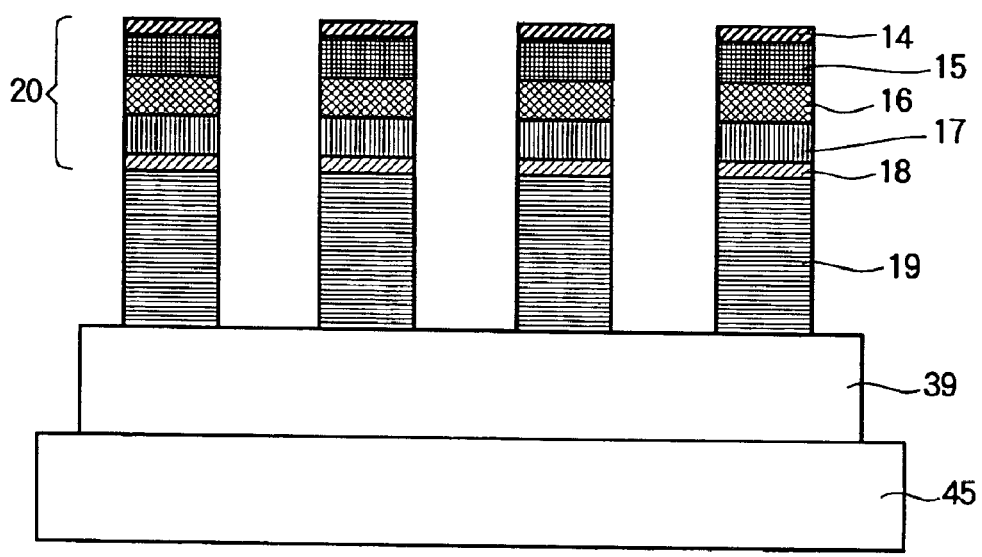
FIG. 28 is a schematic partial cross-sectional view showing the suction of a connecting support material by a suction stage according to another modification of Embodiment 2 of the present invention.

Specifically, after the semiconductor thin film pieces 20 have been peeled off all at once and rinsed with DI water, one surface of the connecting support material 39 opposite to the surface which is stuck to the individual support materials, is placed under suction on a suction stage 45, as shown in FIG. 28. The suction stage may for example employ a porous material, and can apply a vacuum suction to the connecting support material 39 via the pores in the porous material. Herein, the connecting support material 39 may for example be a tacky-adhesive sheet having a polymer as the base material.

Figure 29:
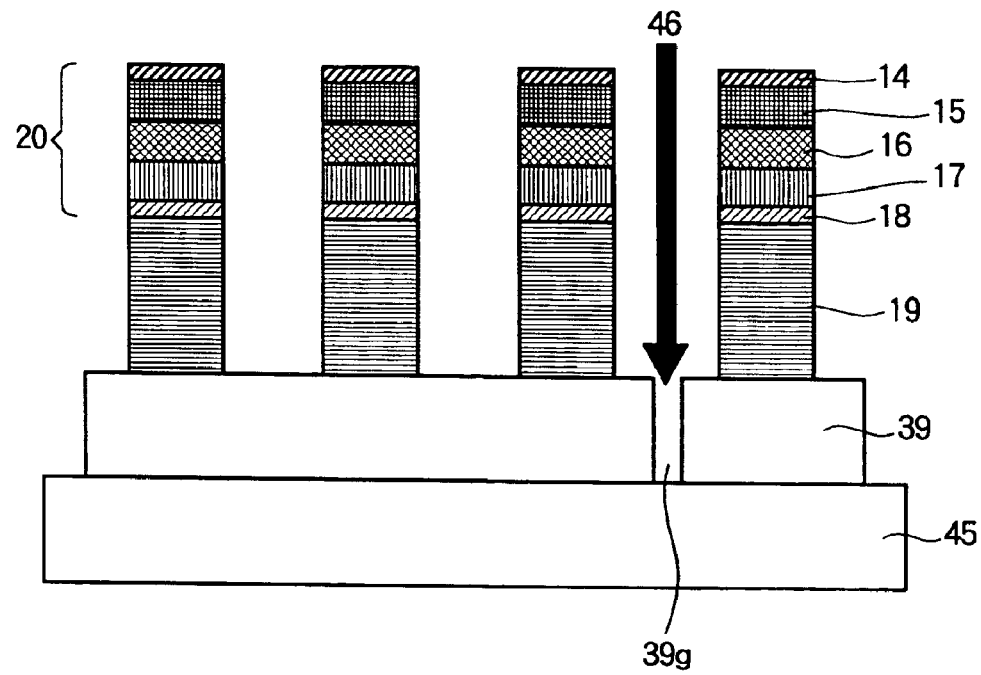
FIG. 29 is a schematic partial cross-sectional view showing the cutting by a laser beam of the connecting support material placed under suction by the suction stage according to the other modification of Embodiment 2 of the present invention.

Next, as shown in FIG. 29, the connecting support material 39 is cut, as indicated by reference numeral 39g, for example by a laser beam 46 at positions corresponding to the gaps between the semiconductor thin film pieces 20, and is thereby divided into split supports 39i corresponding to the semiconductor thin film pieces 20.

Figure 30:
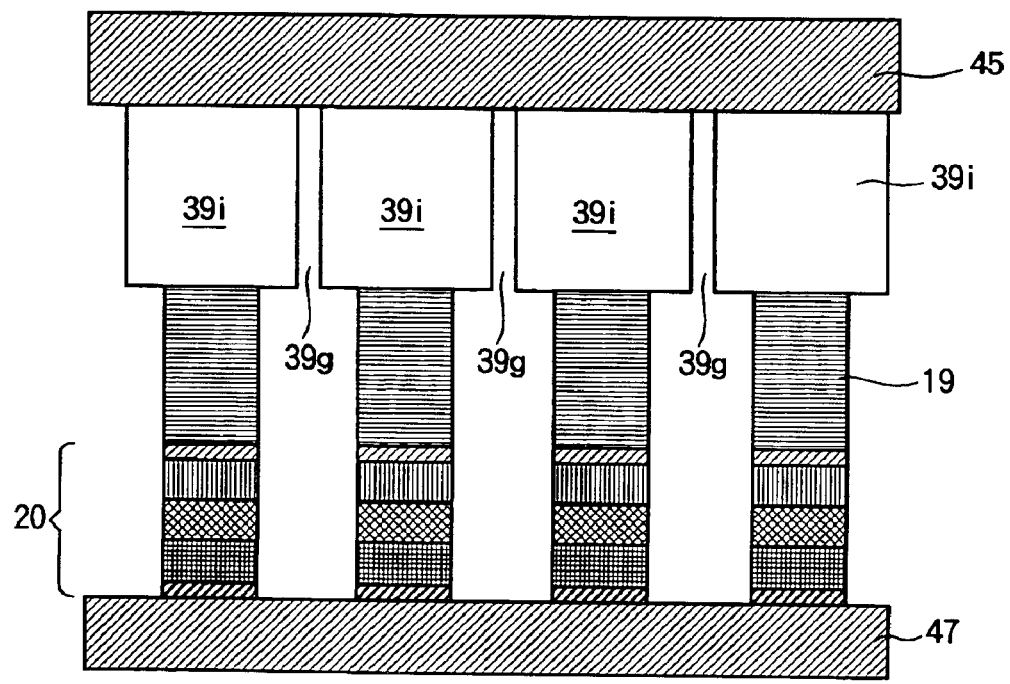
FIG. 30 is a schematic partial cross-sectional view showing the connecting support material cut by a laser beam according to the other modification of Embodiment 2 of the present invention.

Next, as shown in FIG. 30, the semiconductor thin film pieces 20 are temporarily transferred on a carrier stage 47 all at once while the semiconductor thin film pieces 20 are supported by the individual support materials 19 and connecting support materials 39i and placed under suction by the suction stage 45, by bringing the semiconductor thin film pieces 20 into intimate contact with the carrier stage 47. The carrier stage 47 may be a stage of for example a porous material identical to the suction stage 45, and can apply a vacuum suction to the semiconductor thin film pieces 20 via the pores of the porous material.

Figure 31:
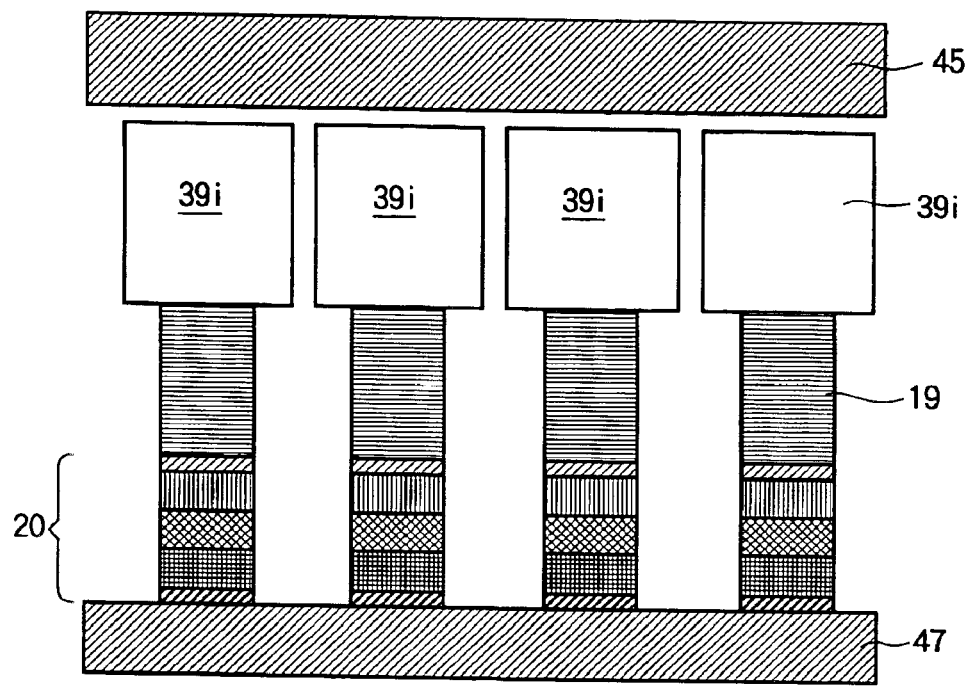
FIG. 31 is a schematic partial cross-sectional view showing the separation of the suction stage in the other modification of Embodiment 2 of the manufacturing method according to the present invention.

Next, as shown in FIG. 31, the vacuum suction of the suction stage 45 is stopped so that all the semiconductor thin film pieces are released from the suction stage 45. In this state, all the semiconductor thin film pieces are subjected to suction by the carrier stage 47.

Figure 32:
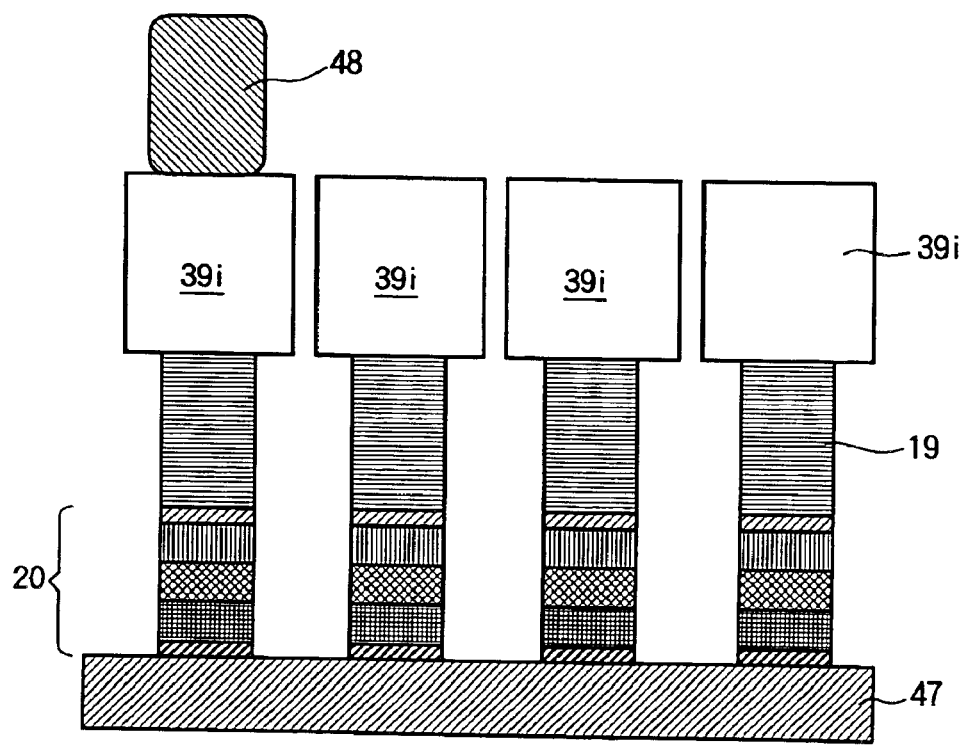
FIG. 32 is a schematic partial cross-sectional view showing pickup of the split support and semiconductor thin film pieces by a pickup collet according to the other modification of Embodiment 2 of the present invention.

Next, as shown in FIG. 32, the surfaces of the split supports 39 are subjected to suction by a pickup collet 48 in order to pick up the individual semiconductor thin film pieces. In this pickup step, the semiconductor thin film pieces are picked up by applying vacuum suction to the split supports 39i by the pickup collet with a stronger force than the force by which the semiconductor thin film pieces are attracted to the carrier stage.

Figure 33:
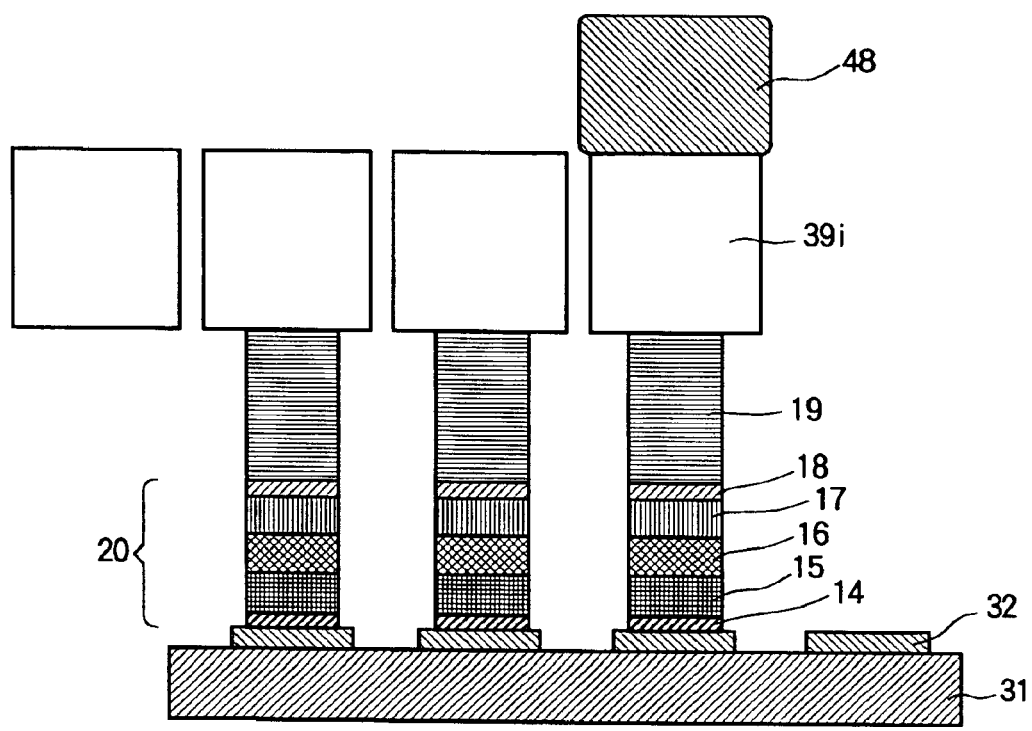
FIG. 33 is a schematic partial cross-sectional view showing the affixing of the semiconductor thin film pieces to the second substrate according to the other modification of Embodiment 2 of the present invention.

Subsequently, as shown in FIG. 33, they are sequentially stuck, by applying suitable pressure and heat, to the second substrate 31 provided for example with the conducting layer 32. FIG. 33 shows the state where two semiconductor thin film pieces are already stuck and the third semiconductor thin film piece is brought in intimate contact with the adhesion area by the pickup collet 48. In this adhesion, as in the case of Embodiment 2, adhesive strength is obtained by intermolecular forces between the contact layer and conducting layer or atomic rearrangements at the bonded interface. Further, the surface may be surface-activated by plasma treatment or the like, or cleaned, prior to adhesion.

Although it takes time to divide the connecting member (support material) 39 into pieces and stick them onto the second substrate one at a time as in this modification, good adhesion control for each semiconductor thin film piece can be achieved depending on the state of each semiconductor thin film piece and the state of the support materials.

Instead of using the laser beam 46, the cutting of the connecting support material 39 may be performed by a cutter or a dicing blade.

The aforesaid modifications of Embodiment 2 can be applied also to Embodiment 3.

Embodiment 4

In Embodiment 2, as shown in FIG. 13, the plurality of transport pieces 28 (each comprising one of the individual support materials 19 and one of the semiconductor thin film pieces 20 fixed thereto) connected by the connecting support material 39, are peeled away (lifted off) from the substrate 11, and as shown in FIG. 14 in FIG. 15, the group of semiconductor thin film pieces 20 are affixed to a predetermined area of the second substrate 31. However, alternatively, they may be temporarily affixed to another support, the connecting support material 39 removed, and the semiconductor thin film pieces 20 then affixed to the second substrate 31 provided with an adhesive agent capable of heat release or UV release as an adhesive layer. In this case, the semiconductor thin film pieces 20 can be affixed to the second substrate 31 after inversion, and selective peeling of individual support materials, peeling of the semiconductor thin film pieces from the above-mentioned another support and adhesion to the second substrate are easily accomplished.

This will now be described in detail.

Figure 34:
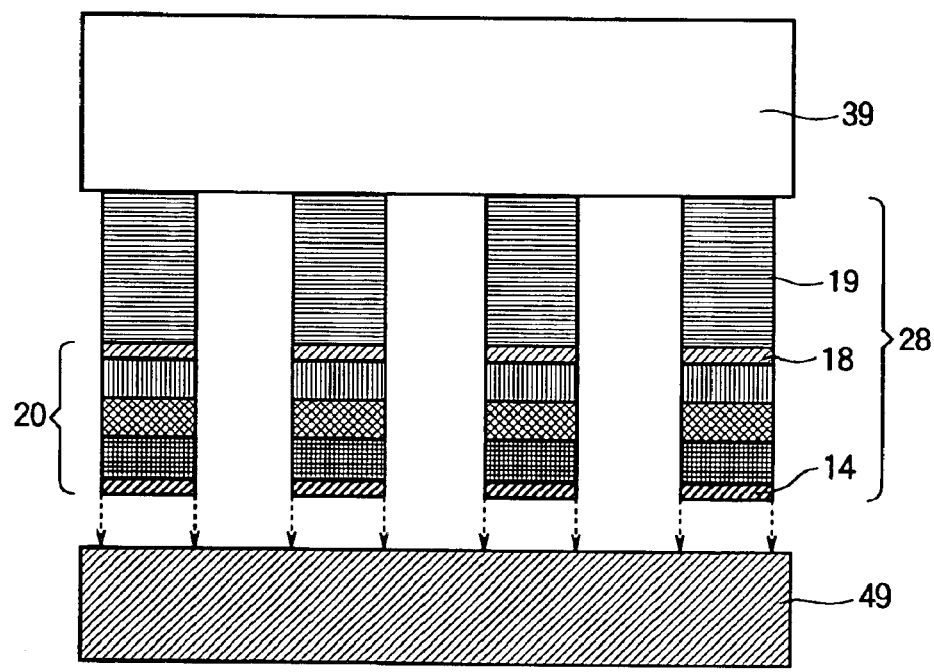
FIG. 34 is a schematic partial cross-sectional view showing the affixing of individual support materials connected by a connecting support material and semiconductor thin film pieces to an intermediate support in a manufacturing method according to Embodiment 4 of the present invention.
Figure 35:
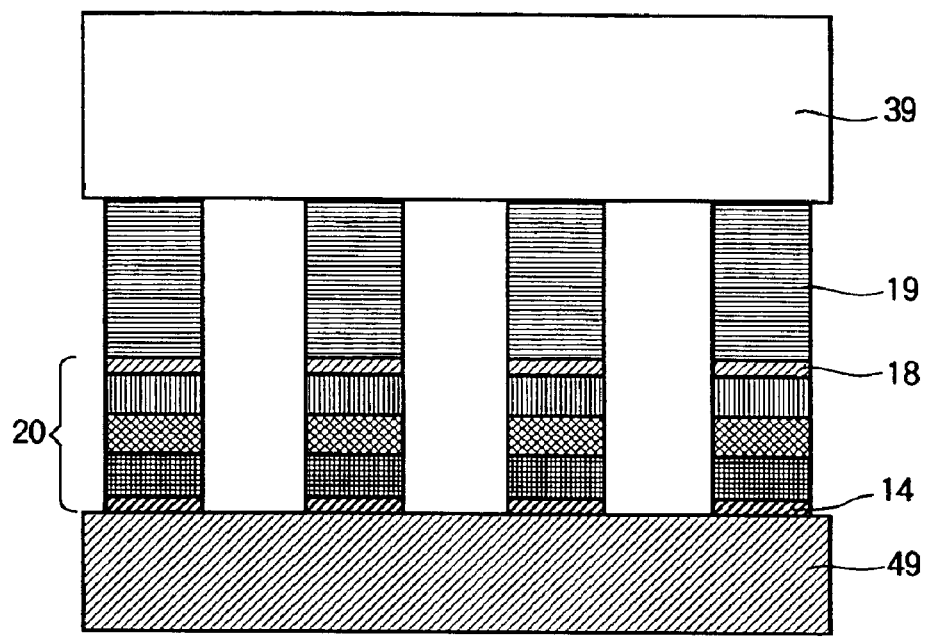
FIG. 35 is a schematic partial cross-sectional view showing a state wherein the individual support materials connected by the connecting support material and the semiconductor thin film pieces have been affixed to the intermediate support in the manufacturing method according to Embodiment 4 of the present invention.

First, following the step of FIG. 13, as shown in FIG. 34 and FIG. 35, the group of semiconductor thin film pieces 20 are affixed to an intermediate support 49.

The intermediate support 49 may for example be a tacky-adhesive sheet affixed to a base material. The tacky-adhesive sheet may for example have repeat adhesion properties, heat release properties or light (UV) release properties. The base material may for example be formed from a polymer material, semiconductor material, ceramic material, glass material or metal material, and it may be a flexible material, or a rigid material. Also, as described later, the layer having the adhesive properties of the intermediate support 49 (layer which sticks to the semiconductor thin film pieces) and the material which will become the base material preferably have reagent resistance to the solution used to remove the individual support materials 19 or the solution used to remove the connecting support material 39.

Figure 36:
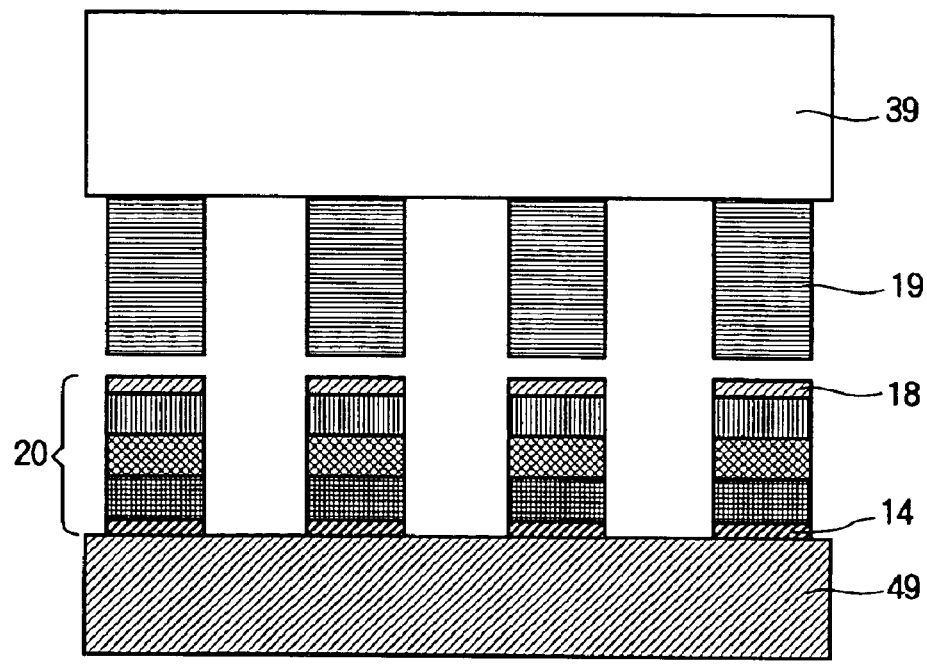
FIG. 36 is a schematic partial cross-sectional view showing the removal of the connecting support material and individual support materials in the manufacturing method according to Embodiment 4 of the present invention.
Figure 37:
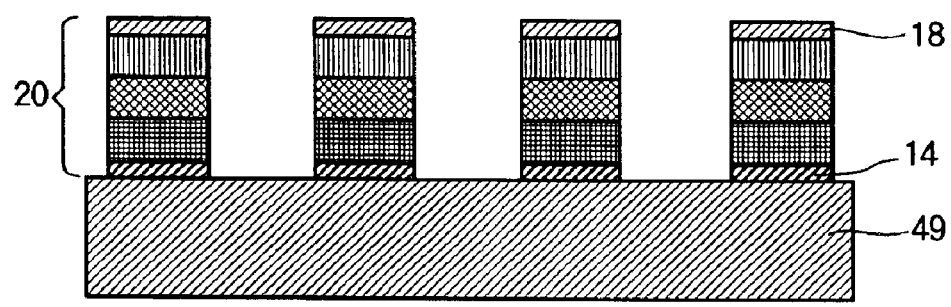
FIG. 37 is a schematic partial cross-sectional view showing a structure obtained when the connecting support material and individual support materials have been removed in the manufacturing method according to Embodiment 4 of the present invention.

Next, as shown in FIG. 36, the individual support materials 19 and connecting support material 39 are peeled away from the surface of the upper contact layer 18 of the semiconductor thin film pieces 20. As a result of this removal, the structure shown in FIG. 37 is obtained.

In this peeling step, reagents which can penetrate the bonding interface between the upper layer 18 and individual support materials 19, for example, an acid or alkali solution, or a solution which decomposes or dissolves the individual support materials 19 but does not affect the intermediate support 49, is used. In a specific example, the individual support materials 19 are a resist layer and the intermediate support 49 is a tacky-adhesive sheet provided with a heat release tacky-adhesive layer having PET as a base material. The structure shown in FIG. 35 may for example then be immersed in 20% hydrofluoric acid. The 20% hydrofluoric acid penetrates the interface between the individual support materials 19 and contact layer 18 of the semiconductor thin film pieces, and can easily separate (peel) the individual support materials 19 from the semiconductor thin film pieces in a short time. The intermediate support 49, the base material and tacky-adhesive layer have resistance to 20% hydrofluoric acid, so the intermediate support 49, and the bonding area between intermediate support and contact layer 14 of the semiconductor thin film pieces is unaffected by immersion in 20% hydrofluoric acid, and the structure shown in FIG. 37 is obtained.

Figure 38:
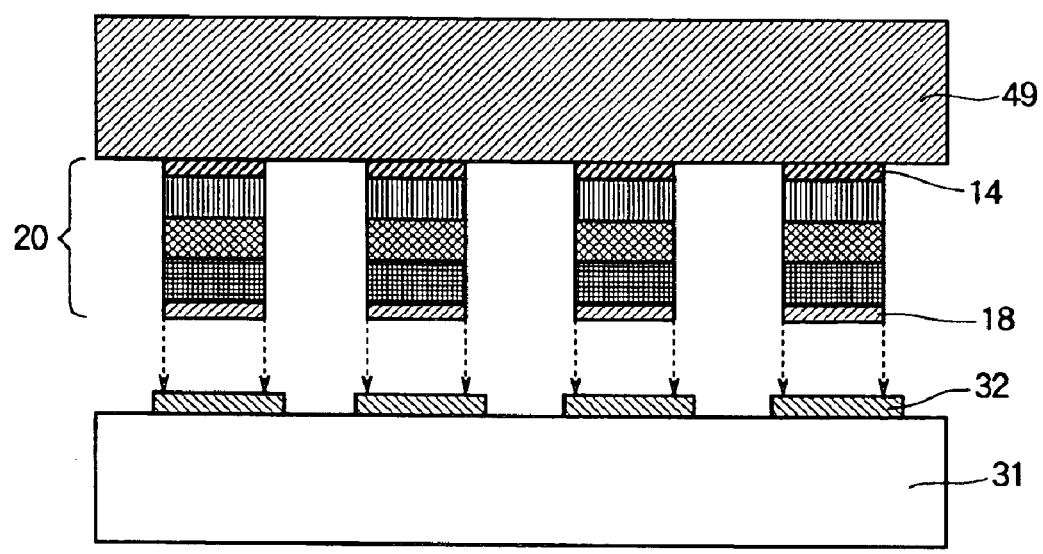
FIG. 38 is a schematic partial cross-sectional view showing the affixing, to a second substrate, of the semiconductor thin film pieces affixed to the intermediate support in the manufacturing method according to Embodiment 4 of the present invention.
Figure 39:
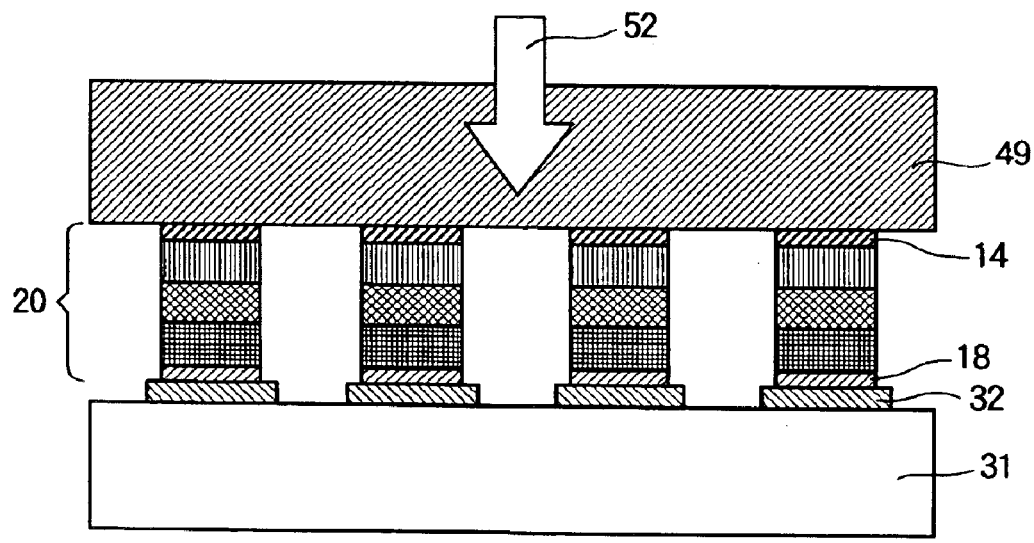
FIG. 39 is a schematic partial cross-sectional view showing a state wherein the semiconductor thin film pieces affixed to the intermediate support, have been affixed to the second substrate in the manufacturing method according to Embodiment 4 of the present invention.

Next, as shown in FIG. 38 and FIG. 39, the assembly of the semiconductor thin film pieces 20 and intermediate support 49 is inverted (turned upside down), and the contact layer 18 of the semiconductor thin film pieces 20 is stuck to a predetermined position of the conducting layer 32 provided on the second substrate 31. In order to obtain sufficient bonding force, suitable pressure (52) and heat are supplied. Herein, as described in the case of Embodiment 1 and Embodiment 2, "stuck" means bonding due to intermolecular forces acting between the contacting surfaces (contact layer surface and surface of the conducting layer 32), or bonding due to atomic rearrangements between the bonding interfaces in intimate contact due to these intermolecular forces.

Next, as shown in FIG. 14, the intermediate support 49 is removed, for example by heating of, light exposure on, or application of an external force to the tacky-adhesive layer of the intermediate support 49, or by immersion in a solution which dissolves/decomposes the adhesive layer, e.g., a solution containing xylene or an organic alkali.

Figure 40:
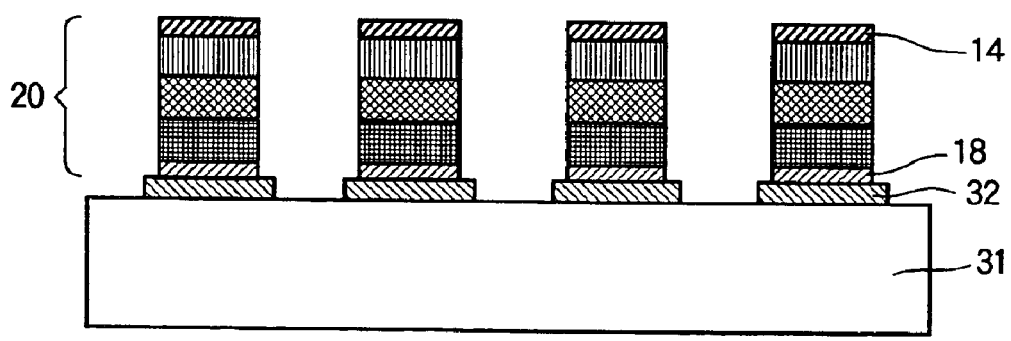
FIG. 40 is a schematic partial cross-sectional view showing a structure obtained when the intermediate support has been removed in the manufacturing method according to Embodiment 4 of the present invention.

As a result of the removal of the intermediate support 49, as shown in FIG. 40, a composite semiconductor device wherein the semiconductor thin film pieces 20 are inverted (turned upside down) and affixed to the second substrate 31, is obtained. Specifically, a structure is obtained wherein the semiconductor thin film pieces 20 are affixed to the substrate 31 such that the upper contact layer 18 in FIG. 5 is connected to the conducting layer 32, and the lower contact layer 14 is situated on the upper side.

Embodiment 4 can also be modified in various ways.

Figure 41:
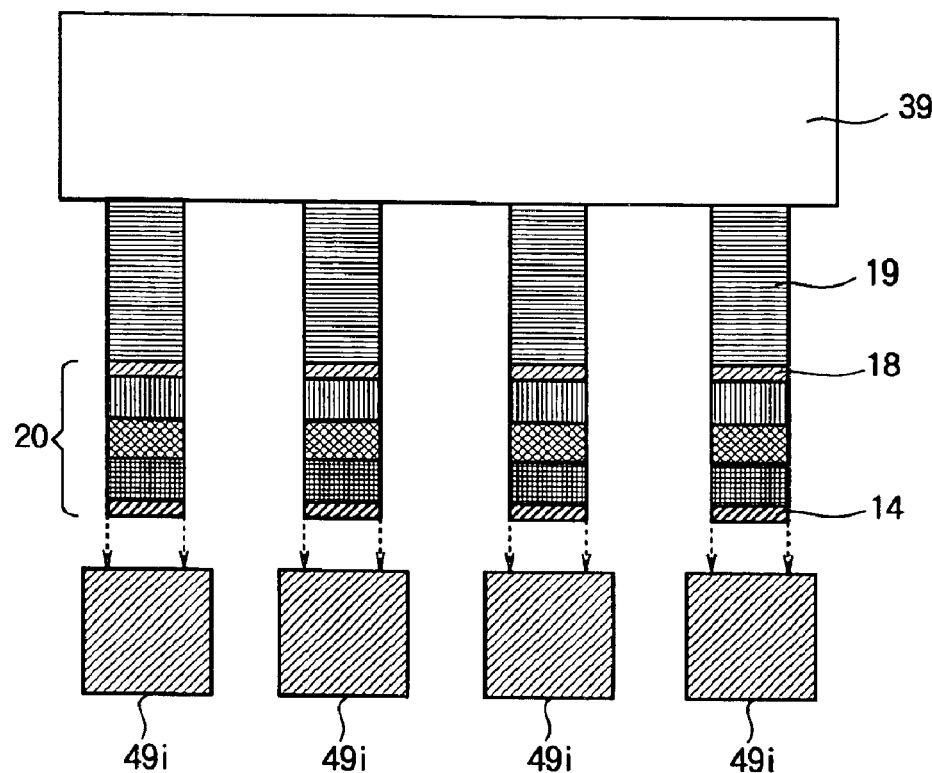
FIG. 41 is a schematic partial cross-sectional view showing the affixing of individual support materials connected by a connecting support material and semiconductor thin film pieces to a split intermediate support according to a modification of Embodiment 4 of the present invention.

For example, in the above example, as shown in FIG. 34, the group of semiconductor thin film pieces 20 are affixed to the intermediate support 49 which is in one continuous piece. Alternatively, as shown in FIG. 41, a plurality of intermediate supports 49i respectably corresponding to the plurality of semiconductor thin film pieces 20 may be provided, and the thin film pieces 20 affixed to the corresponding intermediate supports 49i.

Intermediate supports which respectively cover parts of the substrate 11 for respectively affixing the plurality of thin film pieces 20 thereto may be used. Specifically, the substrate 11 may be divided into plurality of areas, and a plurality of intermediate supports which respectively support the semiconductor thin film pieces 20 in the respective divided areas may be provided.

In the above embodiments, as shown in FIG. 36, the assembly of the individual support materials 19 and the connecting support material 39 was lifted off away from the surface of the upper contact layer 18 of the semiconductor thin film pieces 20, and as shown in FIG. 38 and FIG. 39, affixed to the second substrate 31 with the assembly of the semiconductor thin film pieces 20 and intermediate support 49 inverted (turned upside down). However, alternatively, the semiconductor thin film pieces 20 may also be affixed to the second substrate 31 without inverting them by picking them up with a pickup tool 53.

Figure 42:
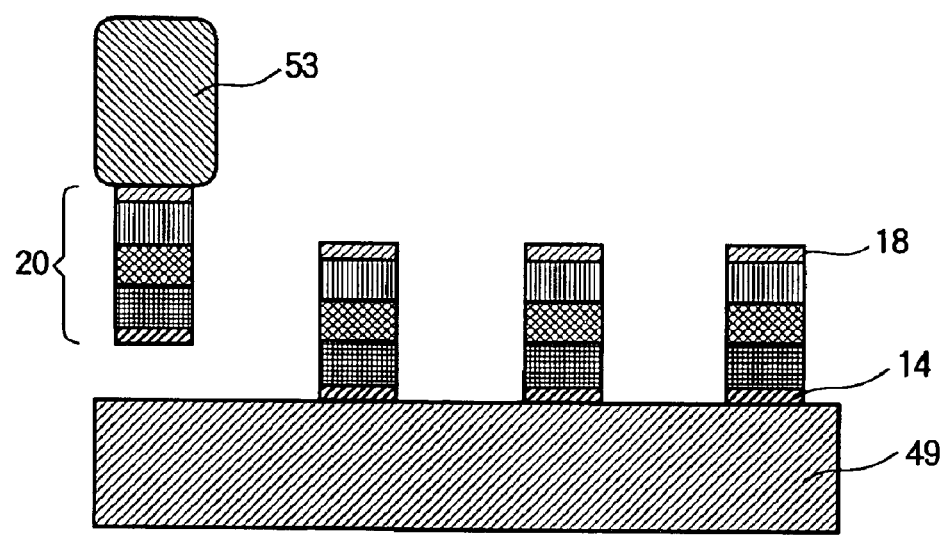
FIG. 42 is a diagram showing pick-up of the semiconductor thin film pieces on the intermediate support by a pickup tool according to the modification of Embodiment 4 of the present invention.
Figure 43:
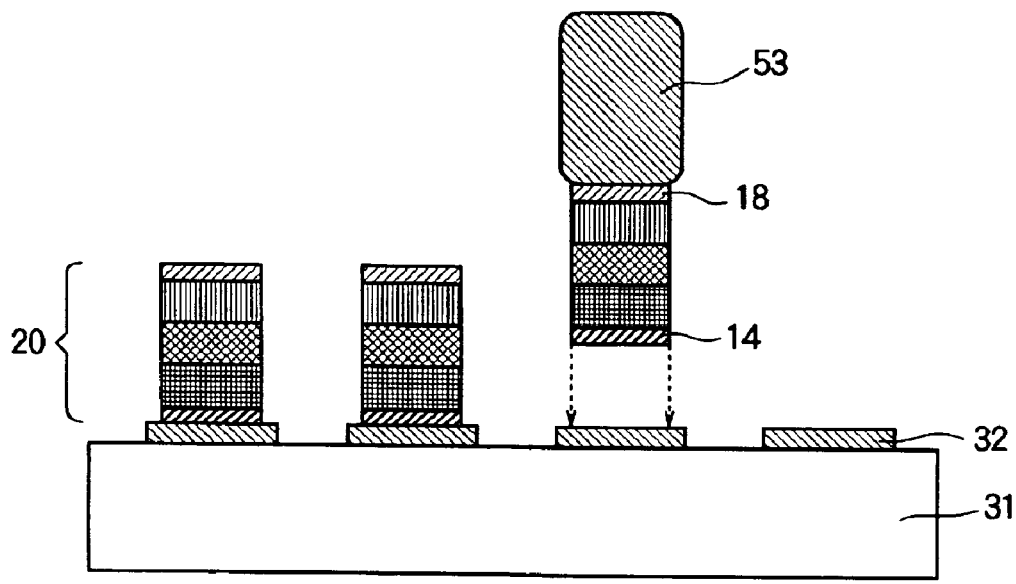
FIG. 43 is a schematic partial cross-sectional view showing the affixing to the second substrate of the semiconductor thin film pieces picked up by the pickup tool, according to the modification of Embodiment 4 of the present invention.
Figure 44:
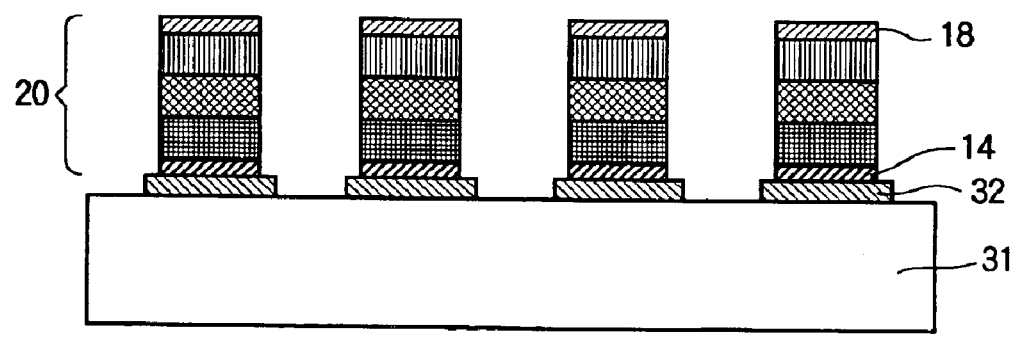
FIG. 44 is a schematic partial cross-sectional view showing a state wherein the semiconductor thin film pieces have been affixed to the second substrate according to the modification of Embodiment 4 of the present invention.

In this case, for example, after the assembly of the individual support materials 19 and connecting support material 39 has been removed (FIG. 37), by the step of FIG. 36, heat, light irradiation or external force is applied to release the adhesion, and the semiconductor thin film pieces 20 are picked up by the pickup tool 53, as shown in FIG. 42, and affixed to predetermined positions on the conducting layer 32 of the second substrate 31, as shown in FIG. 43 and FIG. 44.

Figure 45:
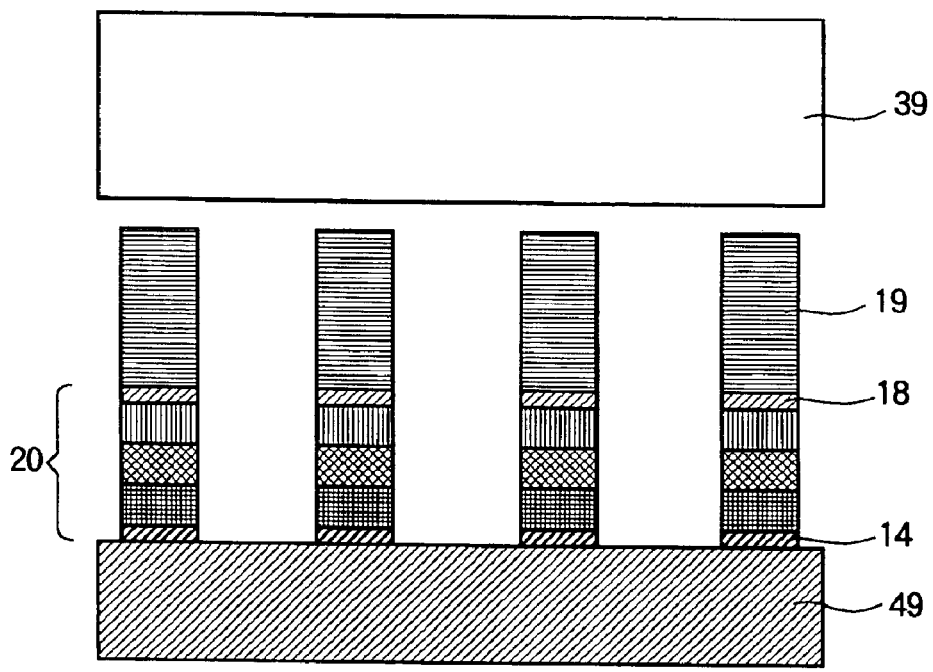
FIG. 45 is a schematic partial cross-sectional view showing the step of separating and removing the connecting support material from the semiconductor thin film pieces and the individual support materials on the intermediate support, according to the modification of Embodiment 4 of the present invention.
Figure 46:
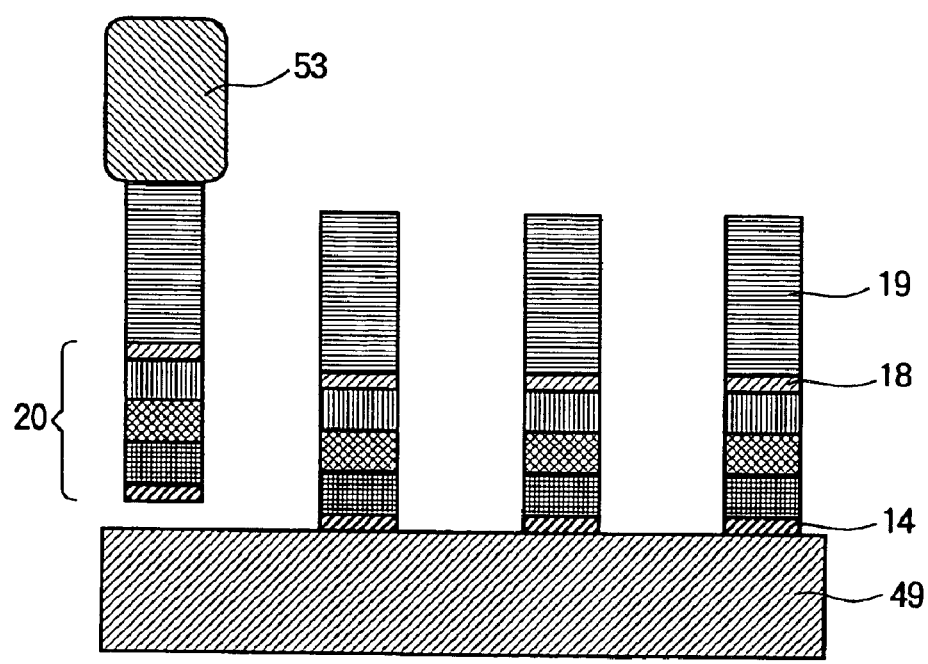
FIG. 46 is a diagram showing pickup of the semiconductor thin film pieces and individual support materials on the intermediate support by a pickup tool according to the modification of Embodiment 4 of the present invention.

Further, in the above example, following the step of FIG. 35, the individual support materials 19 are removed from the semiconductor thin film pieces 20 together with the connecting support material 39, as shown in FIG. 36, and the semiconductor thin film pieces 20 are picked up by the pickup tool 53 as shown in FIG. 42. Alternatively, however, following the step of FIG. 35, only the connecting support material 39 can be removed leaving an assembly of the semiconductor thin film pieces 20 and individual support materials 19, as shown in FIG. 45, and then as shown in FIG. 46, the assembly of the semiconductor thin film pieces 20 and individual support materials 19 picked up by the pickup tool 53, peeled away from the intermediate support 49 and affixed to the second substrate 31.

According to Embodiment 4, the intermediate support was used in addition to the individual support materials and connecting support material, so inversion of the semiconductor thin film pieces is easy.

Also, the peeled (lifted-off) semiconductor thin film pieces may be divided into a plurality of groups, and the groups handled together for easy handling.

This invention is not limited to a composite semiconductor device comprising a light-emitting diode or light-emitting diode array and its driving circuit. This invention may be applied also to transfer of a light-emitting diode, or a light-emitting diode to a different type of substrate (substrate of a material different from the substrate used for epitaxial growth of the semiconductor thin film).

Further, this invention is not limited to a light-emitting diode or light-emitting diode array. For example, it may be applied also to the transfer of a laser diode, integrated circuit element, sensor element such as a light-receiving sensor or pressure sensor, or filter, or other semiconductor elements, to a different type of substrate.

Embodiment 5

Embodiments 5 to 7, which are described next, relate to different types of connecting support material which may be used in place of the connection support described in connection with Embodiments 2 to 4.

In the manufacturing method according to Embodiment 5, a structure shown in FIG. 5 is obtained in a manner which is identical to that described for Embodiment 1.

Figure 47:
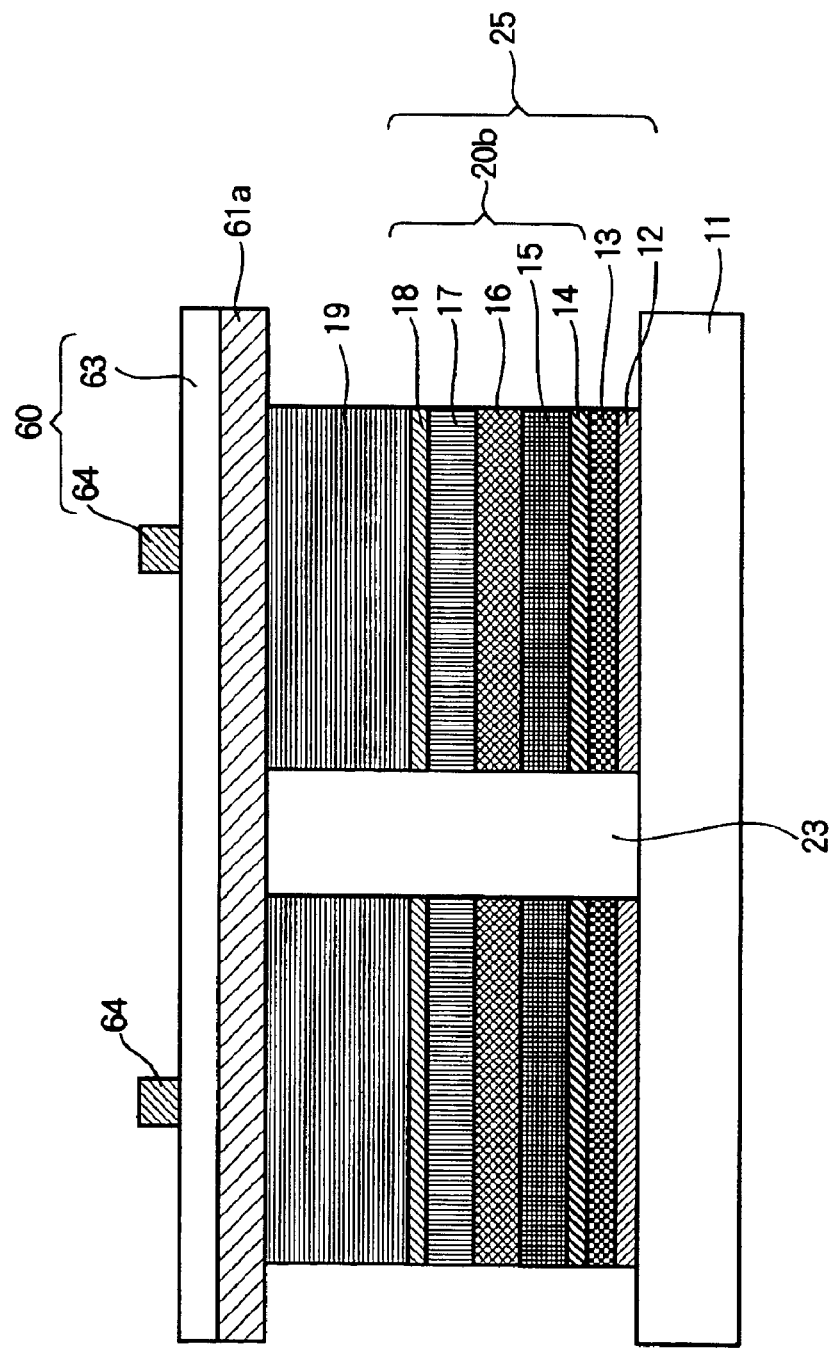
FIG. 47 is a schematic partial cross-sectional view showing a state wherein a connecting support material has been formed in the manufacturing method according to Embodiment 5 of the invention.

Next, as shown in FIG. 47, for example a positive type dry film resist 61a is stuck to the upper surface of the individual support materials 19, and a mesh-like connecting support material 60 is heat-pressed onto the dry film resist 61a.

Figure 48:
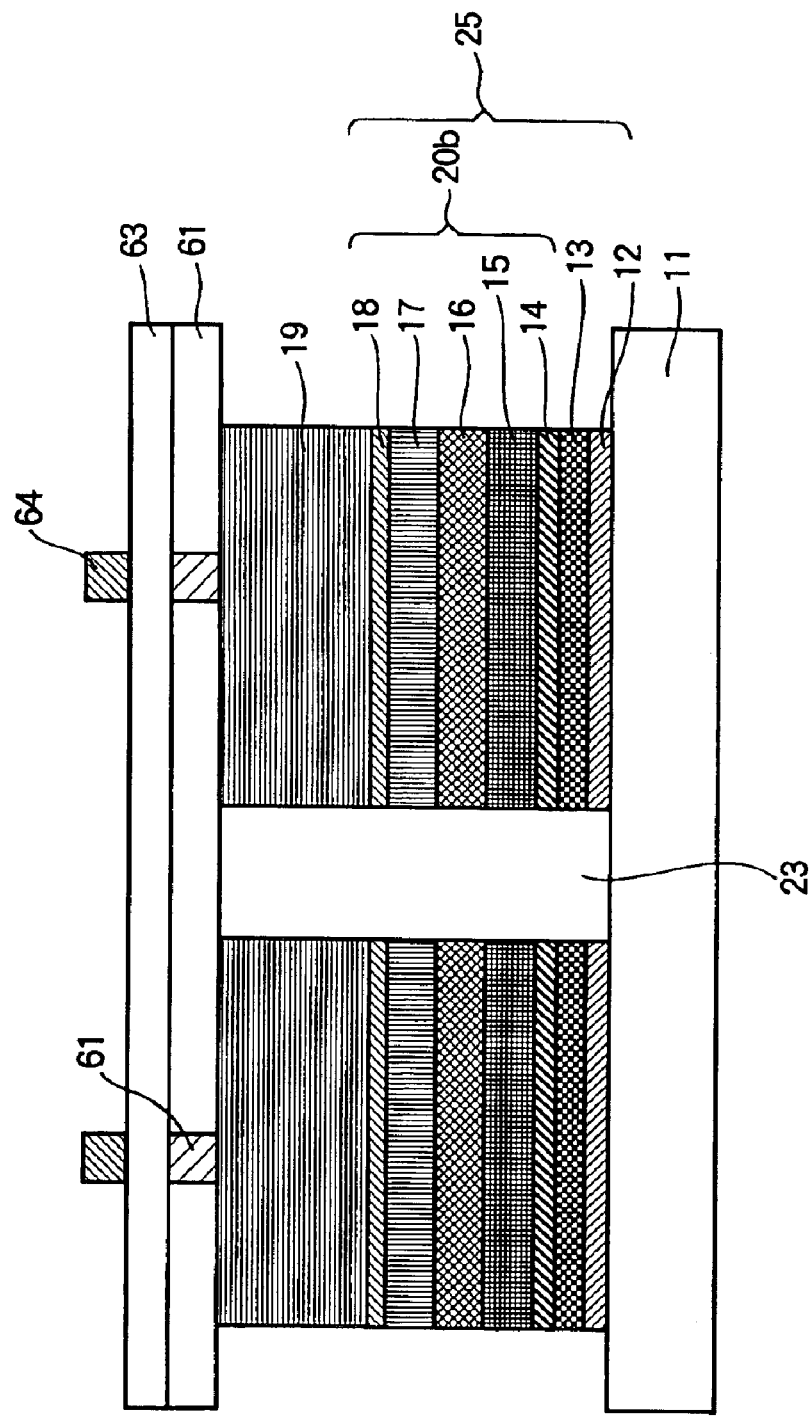
FIG. 48 is a schematic partial cross-sectional view showing a state wherein a dry film resist situated underneath has been partially removed using a mesh structure of the connecting support material as a mask in the manufacturing method according to Embodiment 5 of the invention.

It is noted that in FIG. 47 and FIG. 48 (as well as FIGS. 50, 51, 52, and 53, to be described later), only two of the plurality of semiconductor thin film pieces are shown.

The dry film resist 61a is stuck to the lower surface of the mesh-like connecting support material 60 and upper surface of the individual support materials 19 by heat and pressure, and the connecting support material 60 is thereby fixed to the individual support materials 19, by means of the dry film resist 61a positioned between the individual support materials 19 and the connecting support material 60.

With the positive type dry film resist 61a, for example, the exposed areas can also be selectively removed by a photolithography step (the step comprising exposure and development of the resist) known in the art.

In order that etching solution can easily pass through during the step of etching the peeling layer 13, described later, the connecting support material 60 has a mesh-like form provided with openings 65 between adjacent fibrous members. The mesh-like connecting support material may for example be formed of a group of first fibrous members 63 extending in parallel with each other in a first direction, and a group of second fibrous members 64, which extend in parallel with each other in a second direction perpendicular to the first direction. The first fibrous members and the second fibrous members intersect each other, and a mesh can be formed by bonding the vertical and horizontal fibrous member to each other, or weaving them together. The fibrous members forming the mesh may for example be formed of metal wire having acid resistance to the etching solution used. Alternatively, a core which does not have acid resistance itself can be coated with an acid-resistant polymer such as a polyimide.

As described above, after the structure comprising the connecting support material 60 on the dry film resist 61a has been obtained, the dry film resist is exposed using the fibrous members 63, 64 forming the mesh of the connecting support material 60 as a photomask, and developed. As a result, in the dry film resist 61a, the parts which were aligned with the fibrous members 63, 64 of the mesh remain as an adhesive layer 61, and parts which are not aligned with the fibrous members of the mesh, i.e., the resist material 61a in the parts which were aligned with the openings 65 of the mesh, are removed (FIG. 48 and FIG. 49).

Figure 49:
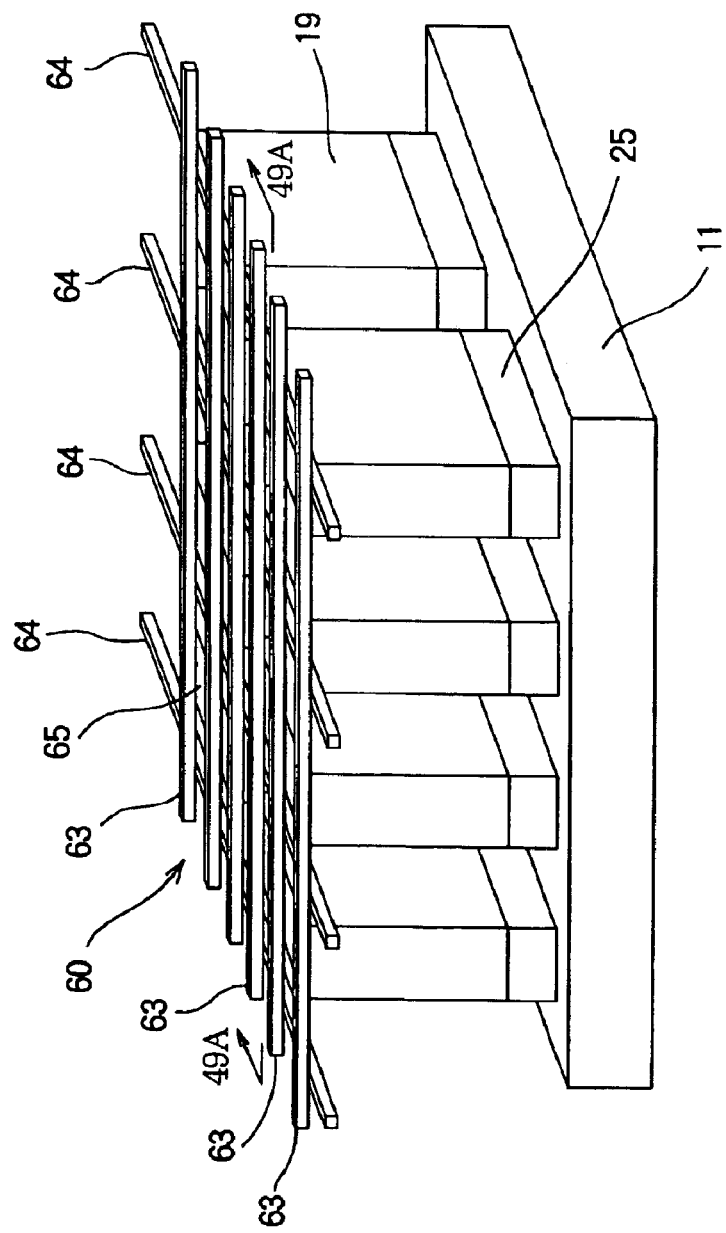
FIG. 49 is a schematic perspective view showing a state wherein the connecting support material has been formed in the manufacturing method according to Embodiment 5 of the invention.

In FIG. 49, the adhesive layer 61 is omitted, and the detailed structure of the semiconductor epitaxial film pieces 25 is omitted.

Also, FIG. 47 and FIG. 48 are schematic partial cross-sectional views through a line 49A—49A in FIG. 49. FIG. 50, FIG. 51, FIG. 52 and FIG. 53, described later, are also schematic partial cross-sectional views through the same position.

The individual support materials 19 are provided to respectively correspond with the semiconductor thin film pieces 20, and support the corresponding semiconductor thin film pieces 20.

The connecting support material 60 is common to the plurality of individual support materials 19, and interconnects and supports them.

As described above, the semiconductor thin film pieces 20 are formed by etching the semiconductor thin film layer 20a using the individual support materials 19 as a mask, so the semiconductor thin film pieces 20 are formed such that they are self-aligned with the individual support materials 19.

Figure 50:
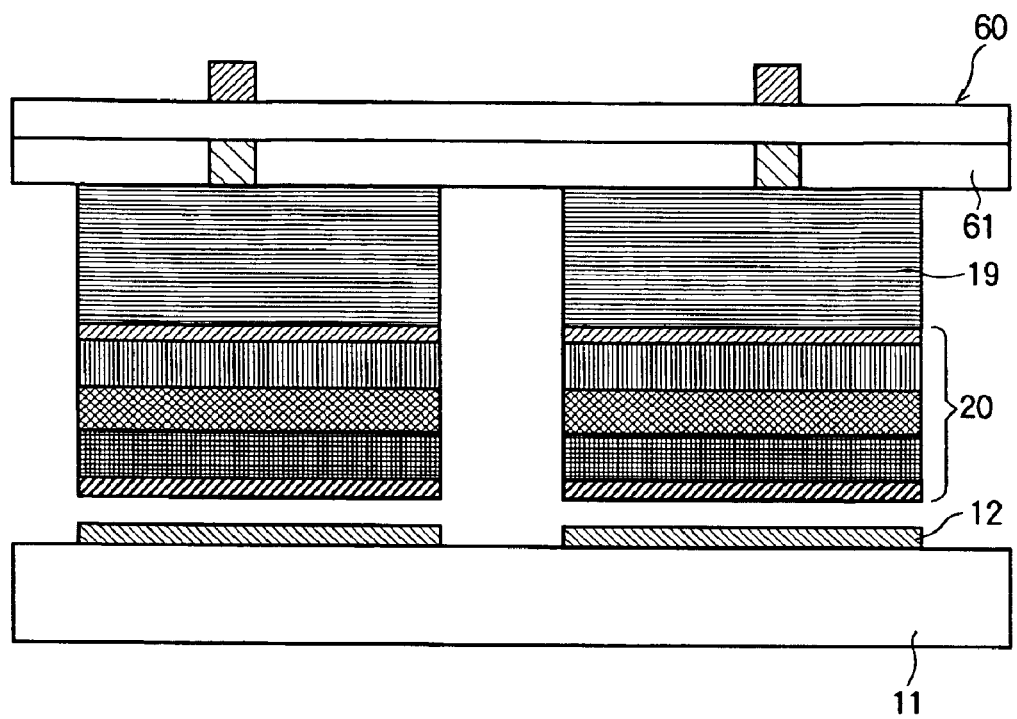
FIG. 50 is a schematic partial cross-sectional view showing a state wherein a peeling layer has been removed in the manufacturing method according to Embodiment 5 of the invention.

Next, the structure shown in FIG. 48 and FIG. 49 is immersed in an etching solution to dissolve or decompose the peeling layer 13, and the semiconductor thin film pieces 20 are lifted off away from the substrate 11 (and buffer layer 12), as shown in FIG. 50.

The etching solution used for the peeling (lifting off) has a high etching rate with respect to the peeling layer 13 but a low etching rate with respect to the layers (14, 15, 16, 17, 18) of the semiconductor thin film pieces 20. An example of such etching solution is 10% hydrofluoric acid (HF).

During this peeling, the etching solution passes through theopenings 65 in the mesh of the connecting support material 60, and through the etching grooves 23 between the epitaxial film pieces 25, and reaches he peeling layer 13.

As the etching solution can pass through the openings in the mesh-like connecting support material 60, a uniform peeling rate is obtained throughout the whole surface of the semiconductor wafer, so uniform peeling of the semiconductor thin film pieces can be performed.

If the mesh of the mesh-like connecting support material 60 is too fine, the etching solution cannot easily pass through it due to surface tension, so the holes 46 preferably have a relatively large size of, for example, 0.5 mm or more, and the surface of the fibrous members of the mesh is preferably given a hydrophilic treatment.

On the other had, the openings of the mesh must be smaller at least in one direction than the dimensions of the thin film pieces (chips) it is desired to support. This is because if the openings of the mesh are larger than the dimension of the thin film piece in both directions, it may not be possible to support the thin film pieces.

In the example shown in the figure, the openings 65 of the mesh are substantially square, while the semiconductor thin film pieces 20 are rectangular, so the length of the side of the square forming each opening 65 of the mesh is made smaller than the length of the longer side of the semiconductor thin film pieces 20.

Figure 51:
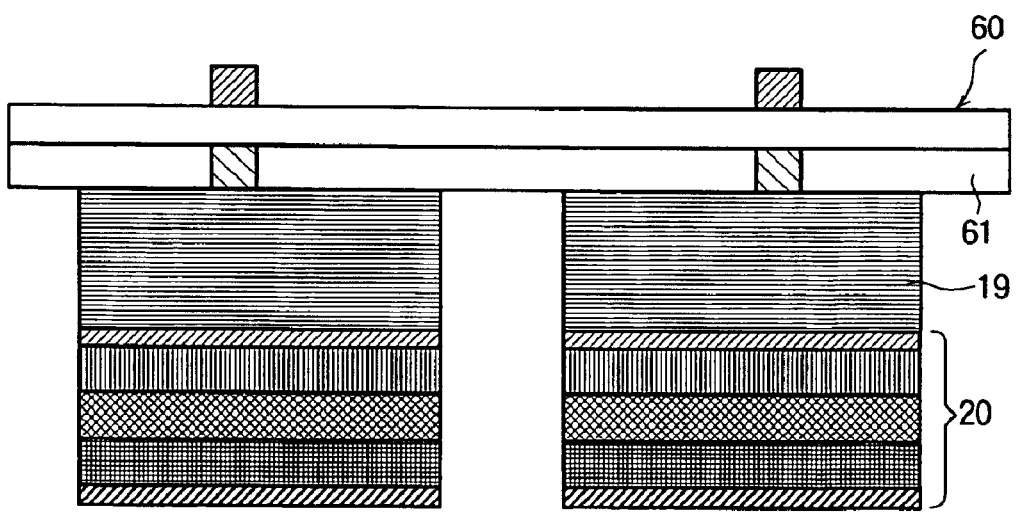
FIG. 51 is a schematic partial cross-sectional view showing a semiconductor thin film pieces which have been peeled away from a first substrate in the manufacturing method according to Embodiment 5 of the invention.
Figure 52:
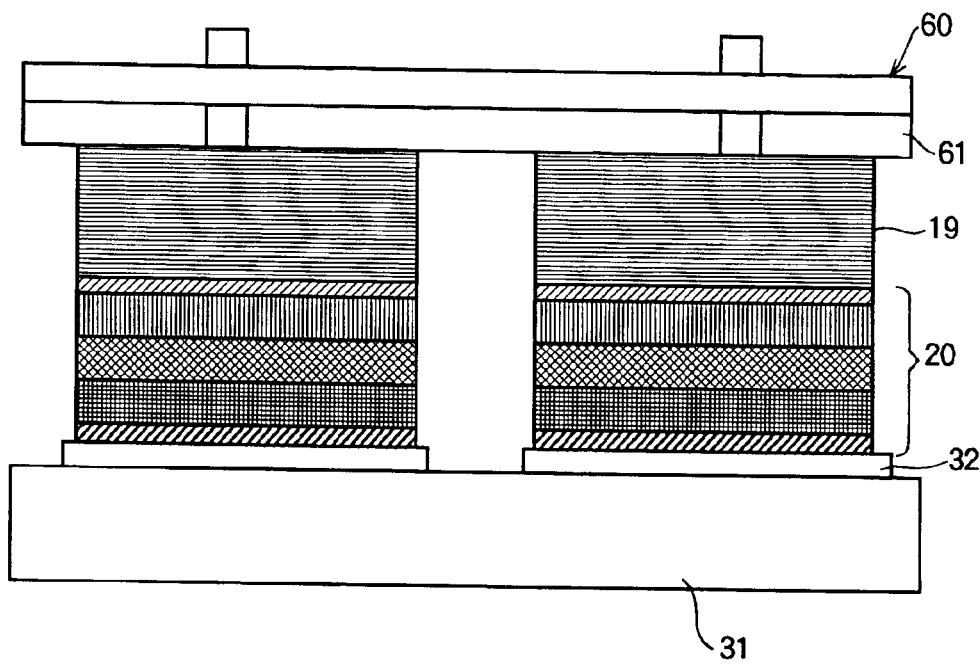
FIG. 52 is a schematic partial cross-sectional view showing a state wherein the semiconductor thin film pieces separated from the first substrate have been bonded to a second substrate in the manufacturing method according to Embodiment 5 of the invention.

Next, the connecting support material 60 (e.g., a frame, not shown, provided around the connecting support material 60) is held by a tool, and transported, as shown in FIG. 51, so that the plurality of semiconductor thin film pieces 20 are moved all at once, and then as shown in FIG. 52, they are affixed to a predetermined area on a second substrate 31, which is a different type of substrate, e.g., Si substrate. At this time, the lower contact layer 14 of the semiconductor thin film pieces 20 is for example bonded to a conducting layer (metal layer) 32 on the Si substrate 31.

In this bonding step, a suitable pressure can be applied in order to obtain a desired bonding strength. Also, a suitable heating may be performed.

Figure 53:
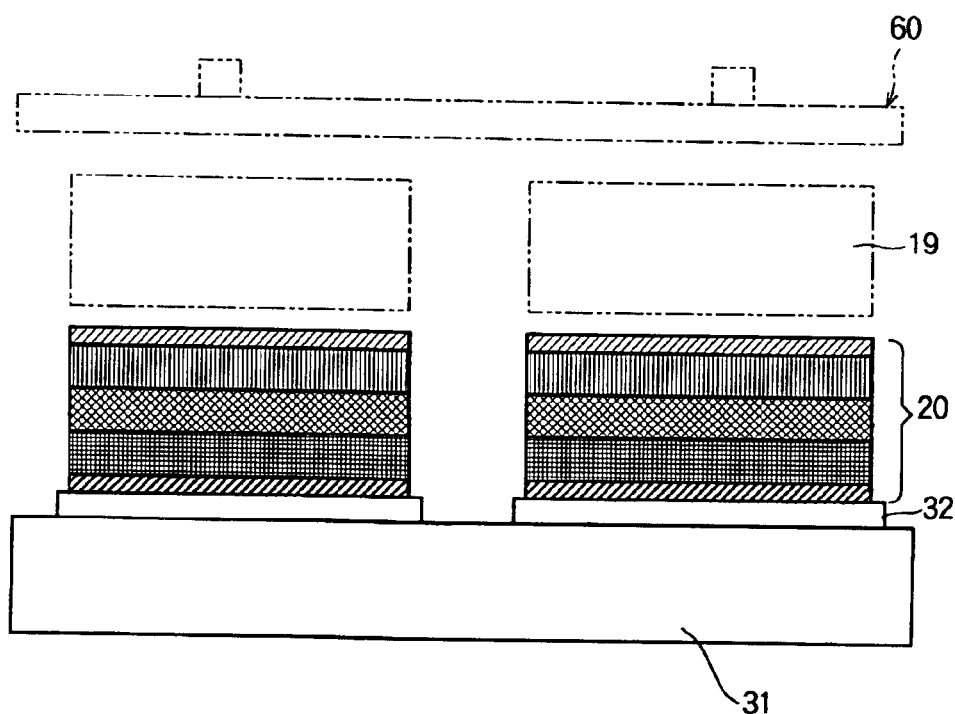
FIG. 53 is a schematic partial cross-sectional view of a state wherein the connecting support material and individual support materials has been removed after bonding the semiconductor thin film pieces to the second substrate in the manufacturing method according to Embodiment 5 of the invention.

Next, by treating the structure comprising the bonded substrate 31, semiconductor thin film pieces 20, individual support materials 19 and connecting support material 60 such as by immersing in a solvent which decomposes or dissolves the individual support materials 19, the connecting support material 60 and individual support materials 19 are removed so as to obtain a combination of the substrate 31 and semiconductor thin film pieces 20 (FIG. 53).

The above-described embodiments can be modified in various manners. For example, the conducting layer 32 on the Si substrate 31 can be omitted.

Also, instead of the Si substrate 31, a substrate of a different material, e.g. a glass substrate, metal substrate, ceramic substrate or a substrate coated with an insulating film such as an $SiO_2$ film, can be used.

Also, the invention may be applied when, instead of the GaAs substrate 11 or AlGaAs layers (15, 16, 17) forming the semiconductor thin film piece, substrates or layers of other materials are used.

In Embodiment 5 of this invention, in the step of peeling (lifting off) the semiconductor thin film pieces from the substrate by chemical etching, the etching solution passes through the openings in the mesh-like connecting substrate 60, so a uniform peeling (lifting-off) rate is obtained throughout the whole surface of the semiconductor wafer, and uniform peeling (lifting-off) of the semiconductor thin film pieces can be performed. Embodiment 6

Figure 54:
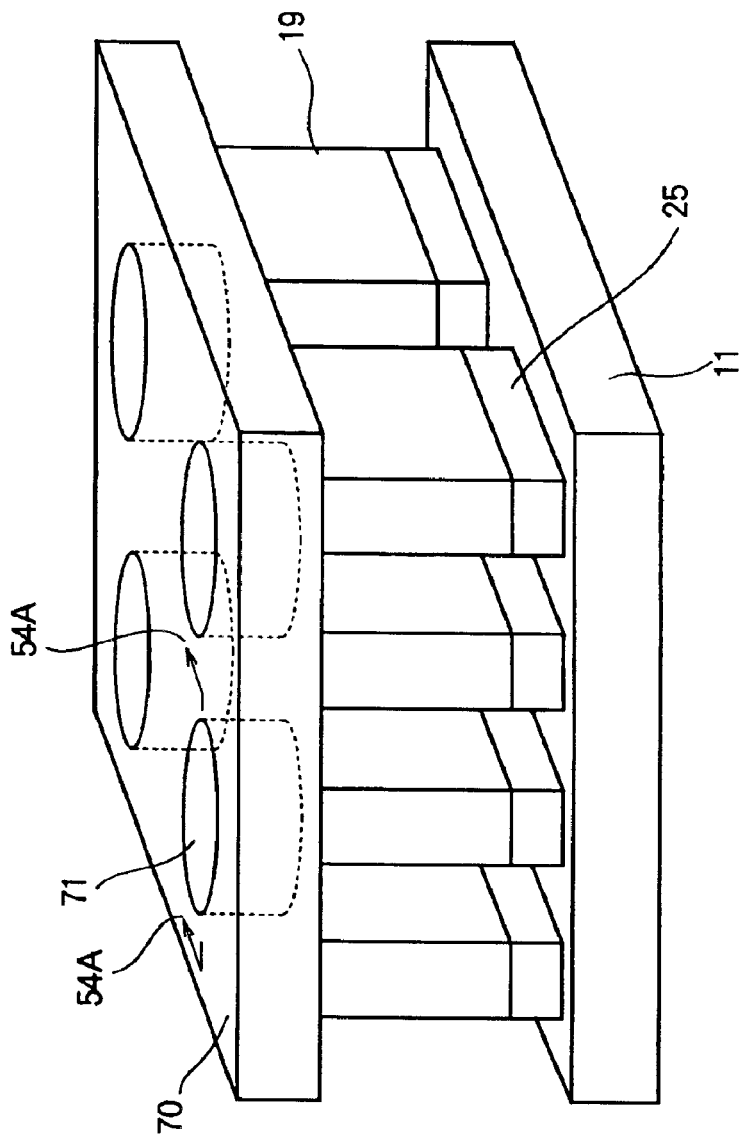
FIG. 54 is a schematic perspective view showing a state wherein the connecting support material has been formed in a manufacturing method according to Embodiment 6 of the invention.
Figure 55:
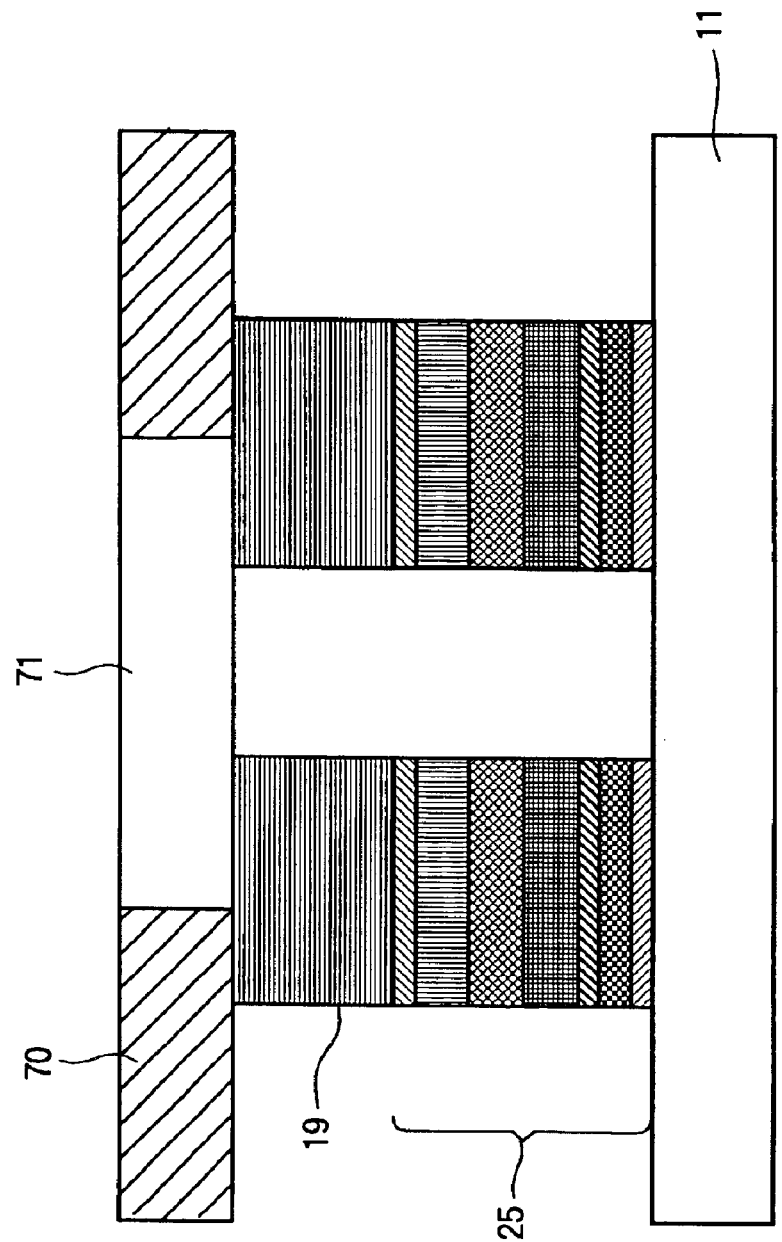
FIG. 55 is a schematic partial cross-sectional view showing a state wherein the connecting support material has been formed in the manufacturing method according to Embodiment 6 of the invention.

In Embodiment 5, the mesh-like connecting support material 60 was used as a connecting support material, but alternatively, a connecting support material 70 shown in FIG. 54 and FIG. 55 can be used. FIG. 55 is a schematic partial cross-sectional view through a line 54A—54A in FIG. 54.

The connecting support material 70 shown in FIG. 54 and FIG. 55 is identical to the connecting support material 60 of Embodiment 5, in that it connects and supports the plurality of individual support materials 19, but it differs in that it comprises throughholes 71, which may be circular, for example, and is formed for example of a photosensitive polymer sheet.

The photosensitive polymer sheet itself has adhesive properties. The photosensitive polymer sheet for example preferably is a dry film resist.

When the dry film resist is laminated, it is stuck for example to the upper surface of the individual support materials 19 by heat and pressure. Selective areas may be removed by exposing and developing. Further, after post-baking, adhesive properties with the individual support materials 19 may be maintained, while adhesive properties on another surface, for example the upper surface, are lost.

In this embodiment, the aforesaid dry film resist is used as the photosensitive polymer sheet, and this is stuck to the individual support materials 19 by its own adhesive properties. Therefore, the separate adhesive layer 61 used in Embodiment 5 is not necessary.

The structure comprising the aforesaid connecting support material 70 is obtained in the following manner.

Figure 56:
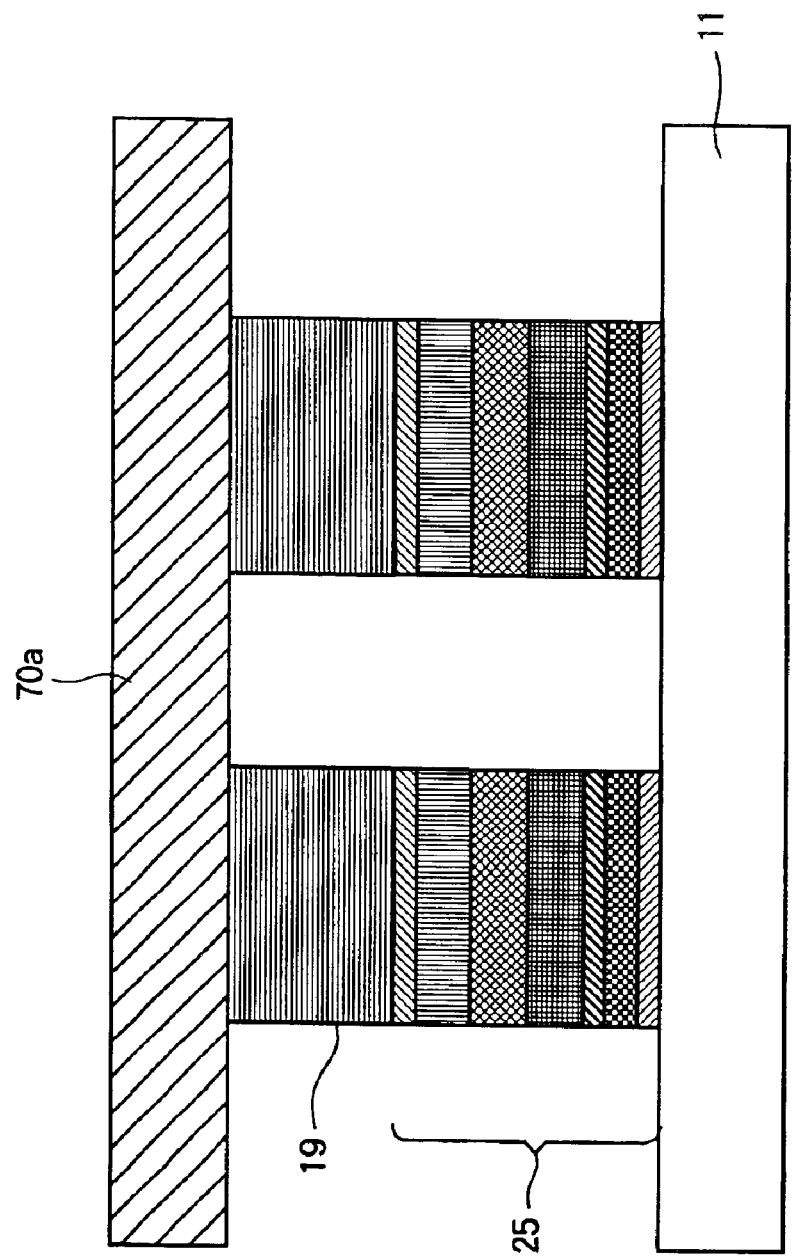
FIG. 56 is a schematic partial cross-sectional view showing a state prior to forming throughholes in the connecting support material in the manufacturing method according to Embodiment 6 of the invention.

For example, after the structure shown in FIG. 5 is obtained, the dry film resist 70a which will become the connecting support material 70 is stuck (laminated) on the individual support materials 19, as shown in FIG. 56. At this time, for example, the photosensitive polymer is fixed to the individual support materials 19 by its own adhesive properties for example while applying suitable pressure and heat.

Next, a plurality of throughholes 71 in predetermined positions are formed in the dry film resist 70a by a photolithography step (exposure and developing) so as to obtain the connecting support material 70 (FIG. 55, FIG. 54). In this exposure step, a photomask corresponding to the pattern of the throughholes 71 is used.

The throughholes 71 preferably have a diameter of for example 0.5 mm or more in order to facilitate passage of the etching solution used to etch the peeling layer 13 in the peeling (lifting-off) step. Also, the surface of the connecting support material 70 is preferably given a hydrophilic treatment.

On the other hand, the hole diameter must be smaller at least in one direction than the dimensions of the thin film pieces (chips) it is desired to support. This is because if the hole diameter is larger than the dimension of the thin film piece in both directions, it may not be possible to support the thin film pieces by the connecting support material 70.

After forming the throughholes 71, suitable post-baking is performed, to enhance the reagent resistance of the connecting support material 70 to reagents used in subsequent steps.

Subsequently, by means of identical steps to those of FIG. 50 to FIG. 53 described in connection with Embodiment 5, the peeling of the semiconductor thin film pieces, bonding to the second substrate and removal of the support materials is performed.

During the peeling, the etching solution passes through the throughholes 71 in the connecting support material 70, a uniform peeling rate can be obtained throughout the whole surface of the semiconductor wafer, and uniform peeling of the semiconductor thin film pieces can be performed, as was also described for Embodiment 5.

The size and shape of the throughholes 71 may be freely adjusted depending on the size of the semiconductor thin film pieces 20 and the properties of the etching solution used.

In the example described referring to FIG. 54 to FIG. 56, the connecting support material was formed of a photosensitive polymer sheet. However, a photosensitive polyimide sheet having photosensitive properties, which may be a polyimide having made into a sheet, like dry film resist, may also be used. The photosensitive polyimide sheet is for example manufactured as follows. Firstly, a liquid photosensitive polyimide (or more specifically, a photosensitive polyamide) is coated on a film such as polyethylene terephthalate, to a desired thickness, the solvent is dried, and a cover film such as polyethylene is provided thereupon.

Herein, a brief description of photosensitive polyimide will be given.

An ordinary polyimide (non-photosensitive polyimide) is formed by heating a polyamic acid (obtained by reacting an aromatic anhydride with a diamine) to approximately 350° C. to eliminate water molecules from the polyamic acid, and form an imide ring. On the other hand, a photosensitive polyimide is a polyimide to which photosensitive properties have been imparted. An alcohol having a double bond (e.g., hydroxyethyl methacrylate) is reacted with an aromatic anhydride to form a dicarboxylic acid, which is then reacted with a diamine to form a polyimide having a double bond in a side chain. This corresponds to a structure wherein the carboxyl group of the polyamic acid has been converted to a structure having a polymerizing double bond. The photosensitive polyimide is obtained by dissolving this polymer in a polar solvent such as NMP (n-methyl pyrrolidone) together with a photoinitiator or sensitizer and adhesion assistant.

Next, the formation of a pattern using this photosensitive polyimide (negative type) will be described. First, the photosensitive polyimide is coated to a suitable thickness (e.g., 10 $\mu$m) by spin coating, and the solvent is dried. Next, this is exposed using a predetermined photomask. A polymerization reaction between the double bonds in the side chain of the polyamide (starting polymer) then occurs due to radicals generated by the photoinitiator due to this exposure, so as to form a crosslinking structure. The starting polymer is dissolved (developed) by an organic solvent, the crosslinked chains are released (thermally decomposed and volatilized) by heat treatment at approximately 350 to 400° C., and a polyimide structure is thereby formed in the exposed areas.

Embodiment 7

Figure 57:
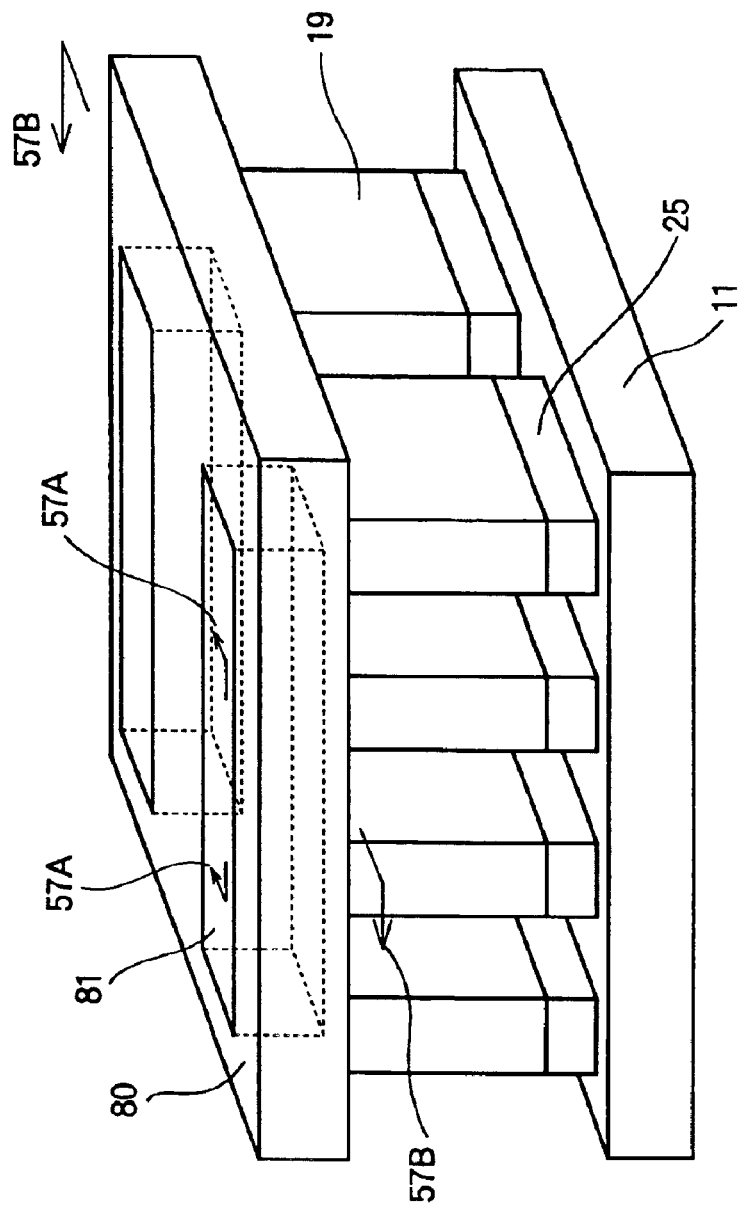
FIG. 57 is a schematic perspective view showing a state wherein the connecting support material has been formed in a manufacturing method according to Embodiment 7 of the invention.
Figure 58:
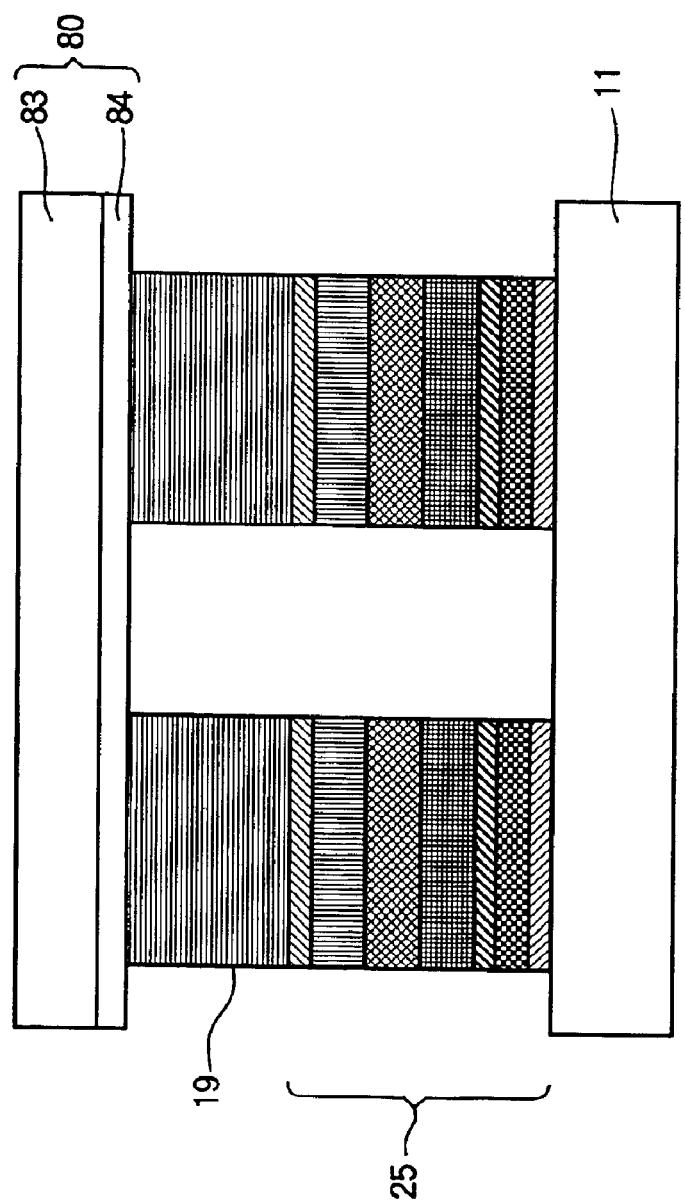
FIG. 58 is a schematic cross-sectional view through a line 57A—57A in FIG. 57.
Figure 59:
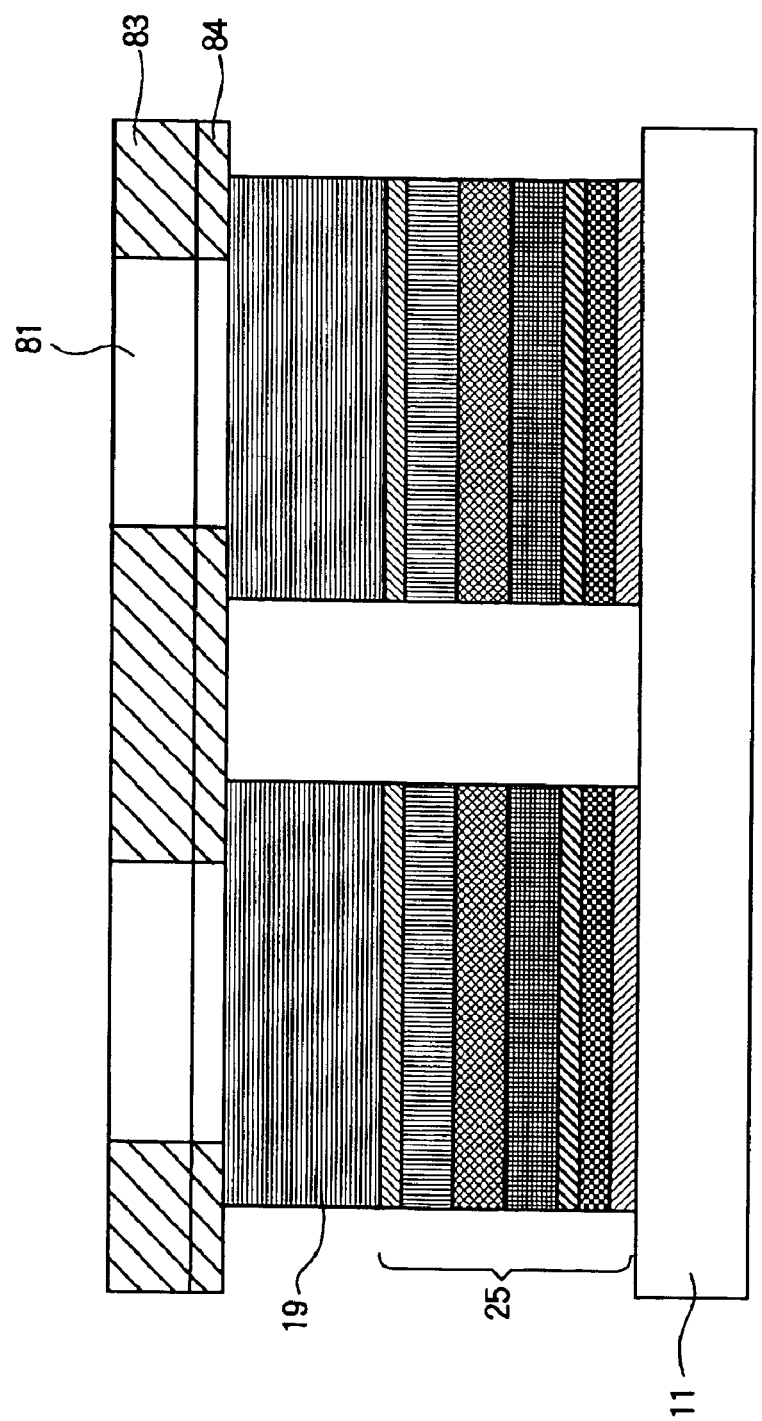
FIG. 59 is a schematic cross-sectional view through a line 57B—57B in FIG. 57.
Figure 60:
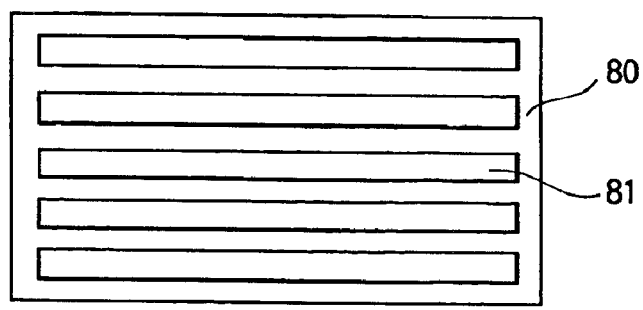
FIG. 60 is a plan view of the connecting support material used in Embodiment 7 of the invention.

In Embodiment 6, the connecting support material 70 is formed of a photosensitive polymer sheet. Alternatively, as shown in FIG. 57 of FIG. 58, FIG. 59 and FIG. 60, a polymer: sheet 80 formed by laminating a tacky-adhesive layer 84 to a polymer sheet base material 83 may be used as the connecting support material. FIG. 58 is a schematic partial cross-sectional view through a line 57A—57A in FIG. 57, and FIG. 59 is a schematic partial cross-sectional view through a line 57B—57B in FIG. 57. FIG. 60 is a plan view of the connecting support material 80. The connecting support material 80 shown in the figure, for example, comprises slit-shaped throughholes 81.

A structure comprising the aforesaid support material 80 is obtained in the following manner.

In addition to the structure shown in FIG. 5, the connecting support material 80 provided with the throughholes 81 is also prepared.

The connecting support material 80 provided separately with the throughholes 81 as described above is affixed (laminated) on the individual support materials 19 of the structure shown in FIG. 5. At this time, the fixing of the individual support materials 19 and connecting support material 80 is performed by the tacky-adhesive layer 84 of the connecting support material 80.

The throughholes 81 preferably have a width of, for example, 0.5 mm or more so as to facilitate passage of the etching solution used to etch the peeling layer 13 in the peeling (lifting off) step. The surface of the connecting support material 80 is also preferably given a hydrophilic treatment.

On the other hand, the width of the throughholes 81 must be less than the size (dimensions in the same directions as the width of the throughholes 81) of the thin film pieces (chips). This is because, if the throughholes 81 are larger than the dimensions of the thin film pieces in both directions, it may not be possible to support the thin film pieces by the connecting support material 80.

Subsequently, by means of identical steps to those of FIG. 50 to FIG. 53 described for Embodiment 5, the peeling of the semiconductor thin film pieces, bonding to the second substrate, and removal of the support materials are performed.

During the peeling, etching solution passes through the throughholes 81 of the connecting support material 80, so in an identical manner to that described for Embodiment 5, a uniform peeling rate can be obtained throughout the whole surface of the semiconductor wafer, and uniform peeling of the semiconductor thin film pieces can be performed.

The size and shape of the throughholes may be freely adjusted depending on the size of the semiconductor thin film pieces 20 and the properties of the etching solution used.

Modification of Embodiment 7

If the throughholes 81 are slit-shaped as in the above example, they may be a continuous slit over the whole area of the GaAs substrate (wafer), or intermittent slits (non-continuous and having suitable gaps therebetween).

Figure 61:
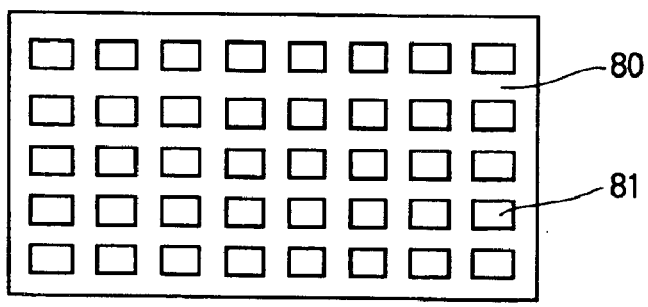
FIG. 61 is a plan view of the connecting support material used in a modification of Embodiment 7 of the invention.

Further, the throughholes may have a shape other than a slit-shape, and may for example be square as shown in FIG. 61.

Figure 62:
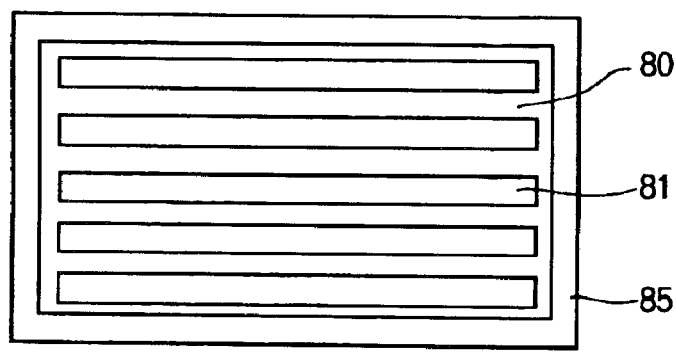
FIG. 62 is a plan view of the connecting support material used in another modification of Embodiment 7 of the invention.
Figure 63A:
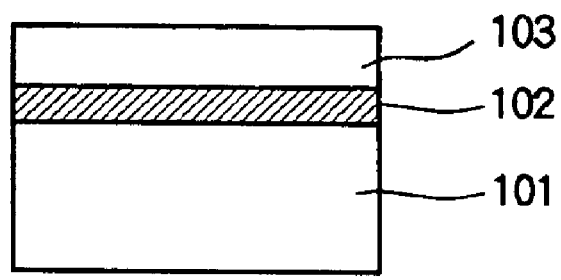
FIGS. 63A and 63B are schematic partial cross-sectional views showing a method of manufacturing a semiconductor device according to the prior art.
Figure 63B:
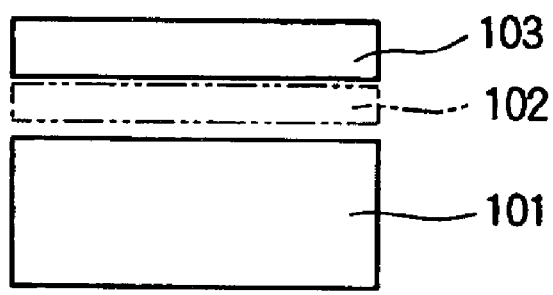

Also, as shown in FIG. 62, the connecting support material 80 may be provided with a strong (rigid) frame 85 on its periphery, and the support material fixed by means of the frame.

According to Embodiment 7, the effects obtained in Embodiment 5 and Embodiment 6 are obtained, and in addition, since there is no need to provide a separate layer to stick the connecting support material 80 to the individual support materials 19, the number of steps can be reduced.

The material of the semiconductor thin film pieces 20 is not necessarily limited to the materials shown in the example, and may for example be another compound semiconductor material such as AlGaInP type, InGaAsP type, GaN type, AlGaN type, InAlGaN type or Si type.

Further, the support material may also be modified in various ways, and the examples described above can also be suitably combined.

In the present invention, an example was described where all the semiconductor thin film pieces 20 on the substrate 11 were peeled away all at once. However, a modification may be made wherein the semiconductor thin film pieces 20 on the semiconductor substrate 11 are divided into a plurality of groups, and peeling and bonding performed separately for each group.

In addition, various peeling (lifting-off) steps may be performed using the support materials for the semiconductor thin film pieces 20 described in this embodiment.

If the size of openings of the mesh or the size of the throughholes (diameter of circular throughholes or width of rectangular throughholes) is small, passage of reagent solution is impeded due to surface tension, so these must both have sufficient size. For example, they should be 0.5 mm or more. On the other hand, if the size of the mesh or size of the throughholes (diameter of circular throughholes or width of slit-shaped throughholes) is larger in either direction than the size (dimensions in the same direction) of each-semiconductor thin film piece (chip), it may not be possible to support the thin film pieces by the connecting support material, so the size of the mesh or dimension of the throughholes must be made less than the corresponding dimensions of the thin film pieces in at least one direction. However, the size of the mesh or throughholes can be made as small as for example 50 $\mu$m to 500 $\mu$m, by immersion in the reagent solution, after applying vacuum suction to the gaps between the support materials and semiconductor thin film pieces.

Further, the surface of the mesh or sheet used as the connecting support material is preferably given a hydrophilic treatment so that the etching solution penetrates it easily.

The individual support materials may also be given a hydrophilic treatment in the same way. Moreover, a surfactant which reduces surface tension can be blended with the etching solution.

When the connecting support material described in connection with Embodiments 5 to 7 is used, the etching solution used for peeling (lifting-off) will have a high penetration rate, the etching rate will be more uniform and a satisfactory semiconductor thin film pieces can be obtained.

What is claimed is:

1. A method of manufacturing a semiconductor device wherein semiconductor thin film pieces are formed on a first substrate, and then transferred to a second substrate, comprising the steps of:

forming a peeling layer on said first substrate;

forming a semiconductor thin film which will become said semiconductor thin film pieces, on said peeling layer;

forming a support material film on said semiconductor thin film;

forming individual support materials by patterning said support material film;

forming grooves extending through said semiconductor thin film to said peeling layer by patterning said semiconductor thin film using said individual support materials as a mask, dividing said semiconductor thin film into said plurality of semiconductor thin film pieces by the grooves, and forming a plurality of assemblies each comprising one of said semiconductor thin film pieces and one of said individual support materials fixed thereto; and separating said semiconductor thin film pieces from said first substrate in a state wherein said individual support materials have been fixed to said semiconductor thin film pieces, and affixing said semiconductor thin film pieces to said second substrate.

2. The method according to claim 1, wherein said step of forming said individual support materials by said patterning is performed by making said individual support materials coincide with the intended shape of said semiconductor thin film pieces to be formed underneath said individual support materials.

3. The method according to claim 1, wherein said individual support materials are formed of an organic material.

4. The method according to claim 1, wherein said individual support materials are formed of a resist material.

5. The method according to claim 1, further comprising the step of giving a hydrophilic treatment to the surface of said individual support materials.

6. The method according to claim 1, wherein a thickness of said individual support materials is 10 $\mu$m to 200 $\mu$m.

7. The method according to claim 1, wherein said semiconductor thin film piece is substantially rectangular, and a length of its shorter side is not more than approximately 500 $\mu$m.

8. The method according to claim 1, wherein the assemblies each comprising one of said individual support materials and one of said semiconductor thin film pieces fixed to the individual support materials are separated from said first substrate using a suction tool which applies suction to said individual support materials.

9. The method according to claim 1, wherein said individual support materials are of a material that is not etched by the etching solution used to remove said peeling layer.

10. The method according to claim 1, further comprising the step of forming a connecting support material which supports said individual support materials, wherein said connecting support material is held so that the plurality of individual support materials and said semiconductor thin film pieces fixed thereto are separated all at once.

11. The method according to claim 10, wherein, in order to support said individual support materials by said connecting support material, said connecting support material is stuck to at least part or all of the surface of said plurality of individual support materials.

12. The method according to claim 10, wherein said connecting support material is formed of an organic material.

13. The method according to claim 10, wherein a material comprising an organic substance is interposed between said connecting support material and said individual support materials.

14. The method according to claim 10, wherein said connecting support material, and said material provided between said connecting support material and said individual support materials, are of a material that is not etched by the etching solution used to etch said peeling layer.

15. The method according to claim 9, wherein the etching solution used to etch said peeling layer is hydrofluoric acid.

16. The method according to claim 10, wherein the semiconductor thin film pieces on said first substrate are respectively divided into a plurality of groups comprising one or more semiconductor thin film pieces, and said step of forming the connecting support material comprises forming one connecting support material for each of said groups.

17. The method according to claim 16, wherein the relative positions of the groups of said semiconductor thin film pieces on said second substrate are made different from the relative positions of identical groups of semiconductor thin film pieces on said first substrate.

18. The method according to claim 10, further comprising the step of cutting said connecting support material to divide said connecting support material into pieces corresponding to the individual support materials.

19. The method according to claim 18, wherein the cutting of said connecting support material is performed by a laser beam.

20. The method according to claim 10, further comprising the steps of:

affixing the semiconductor thin film pieces supported by the individual support materials and connecting support material to an intermediate support; and separating said individual support materials and connecting support material from said semiconductor thin film pieces and said intermediate support, wherein:

said step of affixing said semiconductor thin film pieces to said second substrate comprises affixing the semiconductor thin film pieces supported by said intermediate support to said second substrate.

21. The method according to claim 20, wherein the semiconductor thin film pieces on said first substrate are divided into a plurality of groups comprising one or more semiconductor thin film pieces, and each group is respectively supported by an intermediate support.

22. The manufacturing method of according to claim 20, wherein said intermediate support is of a material that is not separated or decomposed by a solution used to separate said individual support materials.

23. The manufacturing of according to claim 20, wherein the solution used to separate said individual support materials is an organic solvent containing xylene, or an acid which may be hydrofluoric acid.

24. The method according to claim 20, wherein said semiconductor thin film pieces are affixed to said second substrate after inverting said semiconductor thin film pieces using said intermediate support.

25. The method according to claim 10, wherein said semiconductor thin film pieces are separated from said first substrate by chemical etching using an etching solution, and said connecting support material is provided with openings for allowing said etching solution to pass in a direction perpendicular to the surface of said first substrate.

26. The method according to claim 25, wherein said connecting support material is a mesh-like support.

27. The method according to claim 26, further comprising the steps of:

fixing said connecting support material to said individual support materials by means of a dry film resist positioned between said connecting support material and to said individual support materials;

exposing said dry film resist using said mesh-like connecting support material as a mask; and developing to remove the parts of said dry film resist except parts aligned with said mesh-like members.

28. The method according to claim 25, wherein said connecting support material comprises a sheet portion having a tacky-adhesive layer or an adhesive layer, and provided with throughholes.

29. The method according to claim 25, wherein said connecting support material comprises a photosensitive sheet portion, and said method further comprises the step of forming throughholes in said sheet portion after attaching said sheet portion on said semiconductor thin film pieces.

30. The method according to claim 29, wherein said photosensitive sheet portion is formed of a photosensitive etching resist material.

31. The method according to claim 29, wherein said photosensitive sheet portion is formed from a photosensitive polyimide.

32. The method according to claim 29, wherein said photosensitive sheet portion is formed from a photosensitive polymer material.

33. The method according to claim 28, wherein the size of the throughholes is 0.5 mm or more.

34. The method according to claim 29, wherein the size of the throughholes is 0.5 mm or more.

35. The method according to claim 25, further comprising the step of giving a hydrophilic treatment to said connecting support material.

* * * * *